United States Patent [19]
Lorenz et al.

[11] Patent Number: 6,075,774
[45] Date of Patent: Jun. 13, 2000

[54] METHOD AND DEVICE FOR GENERATING A FRAME CHECK SEQUENCE

[75] Inventors: Gary D. Lorenz, Acton; Charles Lee, Ashland, both of Mass.

[73] Assignee: 3Com Corporation

[21] Appl. No.: 08/972,284

[22] Filed: Nov. 18, 1997

[51] Int. Cl.[7] .............................. H04J 1/16; H03M 13/00
[52] U.S. Cl. ............................................ 370/242; 714/758
[58] Field of Search .................................... 370/241, 242, 370/252, 476, 506, 511, 514, 470, 472, 474; 714/758, 776, 781, 807, 48, 52, 774, 801

[56] References Cited

U.S. PATENT DOCUMENTS

| | | | |
|---|---|---|---|
| 4,712,215 | 12/1987 | Joshi et al. | |
| 5,553,085 | 9/1996 | Lauck et al. | 714/752 |
| 5,619,516 | 4/1997 | Li et al. | 714/807 |
| 5,689,518 | 11/1997 | Galand et al. | 714/752 |
| 5,912,881 | 6/1999 | Glaise et al. | 370/252 |
| 5,951,707 | 9/1999 | Chirstensen et al. | 714/752 |
| 6,014,767 | 1/2000 | Glaise | 714/776 |

FOREIGN PATENT DOCUMENTS

| | | |
|---|---|---|
| 0 614 294 | 9/1994 | European Pat. Off. . |
| WO 94/15407 | 7/1994 | WIPO . |

*Primary Examiner*—Chau Nguyen
*Assistant Examiner*—Chiho Andrew Lee
*Attorney, Agent, or Firm*—McGlew and Tuttle, P.C.

[57] ABSTRACT

A self-starting brushless electric motor having: a first motor part (stator) (11) with poles (15S, 16A) arranged in a first pole row, said poles comprising for each winding phase a pole group (13) including a pole pair consisting of a reluctance pole (15S) and a permanent-magnet pole (16A), only one such pole group being provided for each winding phase; a second motor part (rotor) (12) movable with respect to the first motor part (11) and provided with reluctance poles (18A) arranged in a second row of poles opposite to the first row of poles; and a magnetizing winding (17) on the first motor part (11). At least one of the pole rows exhibits a magnetic asymmetry providing a preferential relative direction of movement of the motor parts (11, 12) upon energization of the winding. The poles (15S, 16A) of the pole pair of the first pole row are spaced-apart such that whenever a pole of the pair is magnetically aligned with a pole (18A) of the second pole row, the other pole of the pair is magnetically misaligned with the next adjacent pole of the second pole row. A ferromagnetic auxiliary pole means (20) is provided on the first motor part (11) and positioned such that whenever the permanent-magnet pole (16A) of said pair is magnetically aligned with a pole (18A) of the second pole row, the auxiliary pole means (20) confronts at least one of the other poles of the second pole row across an air gap (19) which separates the pole rows.

19 Claims, 6 Drawing Sheets

METHOD AND DEVICE FOR GENERATING A FRAME CHECK SEQUENCE

This invention relates to a self-starting brushless electric motor of the type which comprises reluctance poles (ferromagnetic salient poles) at least on one of the two relatively moving motor parts and at least one permanent magnet in the pole system.

For convenience, the following description of the invention is limited to motors for rotary movement which have a first motor part, in the following called the stator, provided with a winding, and a second part, in the following called the rotor, arranged inside the stator and rotatable in relation thereto. It will, however, be appreciated that these two parts may exchange places, that the air gap separating the stator from the rotor need not be cylindrical but may equally well be flat or conical, and that the relative movement between the parts of the motor need not be rotary but may equally well be linear or a combination of rotary and linear, i.e. occur simultaneously about and along an axis of rotation.

Electric motors which are designed for unidirectional rotation of the rotor and provided with a single-strand (single-phase) winding supplied with current through electronic drive circuitry require the least possible number of controlled power electronic circuit components in the drive circuitry. Prior art motors of this category include at least one permanent magnet in their pole system to ensure that when the winding is deenergized the rotor will take a position, a starting position, also known as a detent position, in which upon energization of the winding it will be subjected to a magnetic force capable of moving the rotor in a predetermined direction, the preferential direction of rotation.

In many applications, such as in hand tools etc., motors of the kind with which the invention is concerned can have a substantial friction or load torque when the winding is currentless. It is then necessary for the rotor to have well-defined defined starting or detent positions to which it is urged by the permanent magnet or magnets when the winding is deenergized so that it will be reliably moved to such a position instead of stopping in a position in which the torque applied to it upon energization of the winding will be insufficient to set it in motion in the desired direction.

However, this requirement for a high detent torque applied by the permanent magnet or magnets should not be met in such a way that the winding requires a heavy starting current in order to overcome the detent torque. By arranging permanent magnets in the manner described in WO90/02437 and WO92/12567 the magnetic field the winding produces when it is energized will oppose the magnetic field of the permanent magnets applying the detent torque so that the detent torque is substantially reduced or even eliminated when the winding is energized.

In addition to reducing or eliminating the detent torque when the detent torque is no longer needed, the arrangement described in these publications results in a net torque contribution from the permanent magnets. Besides, over the major portion of the path of the flux passing through the reluctance poles, the permanent magnets will oppose and reduce that flux and thereby allow for a reduction of the cross-sectional area of the stator iron in that portion and, consequently, the weight and cost of the motor.

If the load to be driven is not very heavy, a motor having only a single group of poles and an associated single winding coil may be adequate and optimal, because permanent magnets which are very powerful in relation to their weight are now available as a result of the development of the permanent-magnet technology in recent years. However, as a motor having a single permanent-magnet pole will have a nonsymmetrical magnetic circuit, it will not be possible just to remove one of the magnets of a prior art motor, e.g. of the design shown in WO92/12567 and make the other magnet stronger.

The primary object of the invention is to provide a motor of the type represented by the motors disclosed in WO90/02437 and WO92/12567 in which it is possible to have an odd number of permanent-magnet poles, e.g. a single permanent-magnet pole, on the motor part provided with the winding, the stator, and still provide a favourable path for the flux produced by the permanent-magnet pole or poles and/or excited reluctance poles.

This object is achieved by the arrangement of auxiliary pole means defined in the appended claims. The auxiliary pole means provides a separate return path through the stator by way of the rotor as a substitute for those poles associated with a winding coil which serve as return paths in the prior art motor.

Accordingly, the auxiliary pole means provides a favourable path (a path of adequate flux-carrying capacity) to the stator for the magnetically unbalanced flux which exists because in the motor according to the invention there are relative positions of the motor parts in which a stator pole, a permanent-magnet pole or a reluctance pole, is magnetically aligned with and passes flux to a rotor pole although there is no oppositely polarized stator pole belonging to the same winding phase which is also magnetically aligned with a rotor pole.

In the case of small motors according to the invention with reluctance poles on both motor parts, the reduction of the number of pole groups from two to only one may also result in an increased efficiency. This increase is due to the fact that the driving force applied to the movable part by a pole group increases progressively, rather than linearly, with the ampere turns acting on the pole group. Consequently, if all ampere turns act on a single pole group instead of being distributed between two pole groups, fewer ampere turns are required to produce a given driving force.

The principles of the present invention can be applied both to motors with single-strand or single-phase windings and to motors with multi-strand or polyphase windings. In the case of multi-strand or polyphase windings a pole group including a permanent-magnet pole may be provided for more than one winding strand or phase.

Besides the opportunity of providing a single pole group including a permanent-magnet pole (or such a pole group for each winding phase) the invention also offers the opportunity of increasing the force generated by the motor—torque in a rotating motor and linearly acting force or "tractive force" in a linear motor—in one or more respects:

Increasing the torque generated by the permanent magnet or magnets pulling the rotor of the currentless motor to the nearest starting position. Such improvement is advantageous in applications where high frictional torque may appear in the driven object, for instance in shaft seals.

Increasing the torque appearing in a motor whose rotor is stationary in a starting position and whose winding is supplied with the highest current available. Such improvement is also advantageous in the situations mentioned in the preceding paragraph.

Increasing, at least in certain embodiments, the airgap power of the motor for given heat losses, thereby giving a smaller and economically more favourable motor for a given purpose, which may be a great advantage when low motor weight is of importance for certain types of applications, e.g. in hand-held tools or other hand-held objects, but is also an economical advantage in general provided an unavoidable cost increase in the supply electronics does not cancel the effect.

The magnetically active elements in the motor of relevance to the invention are as follows:

Coils on the Stator

In principle the coil of each winding strand or phase forms part of a single electrical circuit.

Ferromagnetic Salient Poles (Reluctance Poles)

In most of the motors according to the invention shown in the appended drawings, ferromagnetic salient poles, in the following also called reluctance poles, are to be found on the stator, alone or together with permanent-magnet poles.

Preferably, the rotor has only reluctance poles.

The reluctance poles on both stator and rotor may be magnetically asymmetrical. For magnetically asymmetrical stator poles the asymmetry should be directed in the opposite direction to the preferential direction of motion of the motor, whereas on the rotor the asymmetry should be in the preferential direction of motion.

Alternatively or in addition, the reluctance poles on both stator and rotor may, however, show a certain magnetic asymmetry in the opposite direction to that described above without this making the motor inoperable.

Permanent-magnet Poles

Motors with only reluctance poles on the rotor must always be provided with a permanent-magnet pole on the stator.

In certain cases it is an advantage if the permanent-magnet pole or poles is/are asymmetrical.

The permanent-magnet poles, both symmetrical and asymmetrical, may have skewed ends or edges, i.e. edges running at an angle to the direction of the rotor axis. In some cases such skewing of the edges of the permanent-magnet poles may be extremely beneficial to the function of the motor. Such skewed edges need not be embodied in geometric shapes. It is sufficient for the edges to consist of demarcation lines (demarcation zones) relating to the imprinted magnetic polarisation (in, for instance, a permanent magnet), i.e. they are imprinted when the permanent-magnet poles are magnetized.

These demarcation lines for zones with the same magnetic polarization may run other than linearly without the function of the motor being greatly affected.

The magnetic asymmetry can be achieved in several ways within the scope of the invention and the appended claims and some of them will be explained below.

As in the prior art motors, the magnetic asymmetry aims at building the preferential starting direction into the motor, but the magnetic asymmetry in motors according to the present invention also serves other purposes.

Basically, an additional purpose of the magnetic asymmetry as utilized in the present invention is to extend what is herein termed the pull-in distance. This is the distance over which a pole, a permanent-magnet pole or a magnetized reluctance pole, on one of the motor parts is capable of attracting a pole on the other motor part sufficiently to cause the two poles to be pulled towards one another from a first stable position, such as the indrawn position, to the next stable position, such as the starting position, in which they are mutually aligned magnetically and, accordingly, no magnetic pull force in the direction of relative movement exists between the poles (only a magnetic pull in a direction transverse to that direction).

During this pull-in motion the permeance between the two poles or, in other words, the magnetic flux passing between them (assuming that the magnetomomotive force is constant) should increase steadily to a maximum value occurring when the poles are magnetically aligned. An extension of the pull-in distance thus calls for a lowering of the mean value of the rate of flux change over the pull-in distance.

Such a lowering can be accomplished by means of magnetic asymmetry, e.g. by providing on at least one of the poles an additional pole part extending in the relative preferential starting direction so that the pole will have a main pole part and an auxiliary pole part which determines the preferential starting direction.

In the starting position and the indrawn position, the auxiliary pole part extends at least to a point in the vicinity of the next pole (as seen in the relative preferential starting direction) on the other motor part and it may even slightly overlap that pole. However, an overlapping portion of the auxiliary pole part must not carry as much flux per unit length of overlap (as measured circumferentially) as overlapping portions of main pole parts.

Assuming that in a rotary motor chosen by way of example both the leading ends and the trailing ends of both the stator poles and the rotor poles extend axially, magnetic asymmetry of a stator pole could in most cases in principle be observed in the following way. The rotor of the motor is replaced with a homogenous ferromagnetic cylinder of the same diameter as the rotor and the flux density in the air gap is measured along an axially extending line on the cylinder surface as the cylinder is rotated to move the line in the preferential direction of rotation past the pole. A graph showing the measured flux density (as averaged over the length of the line) versus the angular position of the line relative to the pole would rise, more or less steadily or in more or less distinct steps, from a point near zero at the leading end of the pole, to a roughly constant value under the main portion of the pole and then decline steeply at the trailing end. If the pole were instead magnetically symmetrical, the graph would be symmetrical and resemble a Gaussian curve.

With suitable modifications the above-described principle is applicable also in other cases, such as for observing magnetic asymmetry of a rotor pole or a pole whose leading and trailing ends do not extend axially. For example, where the ends of the pole are skewed so that they extend along a helical line, the observation can be made with the measurement of the flux density taking place along a correspondingly skewed line.

In the case of permanent-magnet poles with uniform radial dimension and uniform magnetic polarization radially or transversely to the air gap, magnetic pole asymmetry can result from the pole shape. For example, the leading and trailing end of the pole may have different lengths in the axial direction of the motor. A similar effect can also be achieved by magnetically imprinting poles with a corresponding shape in a ring of permanent-magnet material of uniform thickness. In this case the shape of the permanent-magnet ring has nothing to do with the magnetic pattern or "magnetic shape".

Magnetic pole asymmetry can also be achieved by providing a permanent-magnet pole with different radial dimensions at the leading and trailing ends, respectively, (i.e. by giving the air gap at the pole a width that varies in the direction of the relative movement of the motor parts) but giving it uniformly strong magnetization over its entire volume.

Several methods can of course be used simultaneously in order to achieve magnetic asymmetry for the permanent-magnet poles.

There are also several ways of achieving magnetic asymmetry for salient ferromagnetic poles, the reluctance poles. One method is to arrange the surface of such a pole facing the air gap asymmetrically with regard to its dimension (width) in the axial direction of the motor, in which case the entire pole surface may be situated at the same radial distance from the axis or rotation.

Another method is to make the projection surface of the reluctance pole (the surface facing the air gap) symmetrical, but vary its radial distance from the axis of rotation, i.e. vary the width if the air gap along the pole surface, step-wise or continuously, in relation to an imagined (cylindrical) surface on the other motor part.

A third method is to vary the magnetic saturation flux density along the pole surface. This can be achieved by using different magnetic materials for different parts of the reluctance pole, or it can be achieved by varying the filling factor of the laminated reluctance poles, or by means of punched recesses, for instance, below the actual pole surface (so that the actual pole surface appears to be homogenous), or by varying the radial dimension of an auxiliary pole part such that it will have a shape resembling the profile of the curved beak of a bird when viewed in the direction of the axis of rotation.

Of course several methods of achieving magnetic asymmetry can be used simultaneously. The choice of how to achieve asymmetry is usually dependent on a balance between the manufacturing costs of the motor and the cost of the supply electronics, since the choice of the type of asymmetry may affect the size of the power electronic switch elements included in the supply electronics.

As will become apparent, in motors embodying the invention magnetic asymmetry may characterize not only an individual pole of a group of poles which are associated with a common winding coil such that all poles of the group are subjected to the magnetic field produced upon energization of the coil. It may also characterize the group of poles and then not only by virtue of magnetic asymmetry of one or more individual poles but also by virtue of an asymmetrical positioning of an individual pole within a pole group.

A pole of a pole group on the stator is asymmetrically positioned if a rotor pole is moved through a distance longer or shorter than one-half rotor pole pitch when it is moved between a position in which it is magnetically aligned with that stator pole and the next adjacent position in which any pole on the rotor is magnetically aligned with a stator pole of a different pole type or, in the case of a stator having only permanent magnets, a pole of different polarity.

In other words, a permanent-magnet pole, for example, on the stator is asymmetrically positioned with respect to a reluctance pole in the same or a different pole group if a rotor pole traverses a distance which is longer or shorter than one-half rotor pole pitch when the rotor moves between a position in which a rotor pole is magnetically aligned with that permanent-magnet pole, i.e. is in the starting position, to the next following or next preceding position in which a rotor pole—which may be any rotor pole—is in an indrawn position.

In a pole row comprising permanent magnet poles of alternating polarity, the north-pole permanent-magnet poles may be displaced in either direction from a central position between the south-pole permanent-magnet poles with all like poles substantially equally spaced.

It should be noted in the context of the present invention that a pole group (pole unit) may comprise a single pole or a plurality of poles associated with a magnetizing coil.

The invention will now be described in more detail with reference to a number of exemplifying embodiments shown schematically in the accompanying drawings.

FIG. 1A shows an end view of a first embodiment of a rotating motor.

FIG. 1B is a developed view of a section of the rows of poles in the motor viewed from within the air gap and axially displaced from their working position, but otherwise in the position in relation to each other that they assume in FIG. 1A;

FIG. 1C shows the motor in the same way as FIG. 1A, with the permanent-magnetic field lines in the stator and rotor included;

FIG. 1D is a longitudinal sectional view of the motor of FIG. 1;

FIG. 1E is a view similar to FIG. 1B but shows the stator and rotor poles in the same axial position and displaced to a different relative angular position and also includes a graph representing the magnetic attraction force acting between a stator pole and a rotor pole.

FIGS. 2A and 2B are views corresponding to FIGS. 1A and 1B showing a second embodiment;

FIGS. 3A and 3B are views corresponding to FIGS. 1A and 1B showing a third embodiment;

FIG. 4 is a view corresponding to FIG. 1A and shows a fourth embodiment;

FIGS. 5A and 5B are views corresponding to FIGS. 1A and 1B showing a fifth embodiment;

FIGS. 6A, 6B and 6C are views corresponding to FIGS. 1A, 1B and 1C showing a sixth embodiment, namely a two-phase motor.

FIGS. 7A to 7D are developed views resembling FIG. 1B of pole combinations which differ from each other in respect of the shape and placement of a permanent-magnet pole on the stator.

Throughout the drawings, the polarity of the permanent-magnet poles which are magnetized transversely to the air gap, is indicated by an arrow-head pointing towards the north-pole side of the magnet.

Moreover, in all embodiments shown in the drawings except that shown in FIGS. 3A, 3B, the asymmetry of the stator and/or the rotor poles is directed such that the preferential starting direction of the rotor is counterclockwise.

The motor shown in FIGS. 1A–1D is a rotating motor, as are the other motors also, with a first motor part in the form of a laminated ferromagnetic stator 11 and a second motor part in the form of a laminated ferromagnetic rotor 12 journalled for rotary movement in the stator by suitable bearings as shown in FIG. 1D. The axis C of rotation of the rotor is indicated by a small circle or a dash-dot line and designated by C, and the preferential direction of rotation is indicated by an arrow (counterclockwise in all illustrated embodiments).

The stator 11 has two diametrically opposite pole groups 13 and 14. The pole group 13 comprises two salient ferromagnetic poles 15S, also called reluctance poles, which are spaced from each other circumferentially, and a permanent-magnet pole 16A arranged between them. The other pole group 14 is identical with the pole group 14 except that it has no permanent-magnet pole.

The surfaces of all poles 15S and 16A facing the rotor 12 are located on an imaginary cylindrical surface that is concentric with the axis of rotation 12A of the rotor.

For each pole group 13, 14 the stator 11 is also provided with a coil 17 wound around the pole group and forming part of a common magnetizing winding circuit, i.e. both winding coils are energized with the same pulsating direct current.

On the outside of the rotor 12, distributed uniformly around its periphery, are four uniformly spaced salient ferromagnetic poles 18A, also called reluctance poles. The surfaces of these poles facing the stator are located on an imaginary cylinder that is concentric with the axis of rotation C, a short distance from the cylinder containing the pole surfaces of the stator, so that the pole surfaces of the stator and those of the rotor form a cylindrical air gap 19 between them. The pole pitch of the rotor 12 corresponds to the spacing of the reluctance poles 13S within each pole group on the stator 11.

In the embodiment shown in FIGS. 1A to 1D, all the poles 15S, 16A on the stator 11 are located in a first annular pole row, and the poles 18A on the rotor 12 are located in a second annular pole row in the same plane perpendicular to the axis of rotation, so that during rotation all poles on the rotor sweep over and interact with all poles on the stator. The motor may of course have several axially separated pole rows or sets of pole groups arranged in this manner. Furthermore, instead of being located in closed paths or rows running peripherally around the rotor, the poles on each motor part may be arranged, for instance, on a helical path.

Throughout the following description, a suffix letter S of the numerical references used in the drawings for reluctance and permanent-magnet poles indicates that the pole is magnetically symmetrical. Similarly, a suffix letter A indicates that the pole is magnetically asymmetrical.

Accordingly, the pole faces on the reluctance poles 15S of the stator 11 are magnetically symmetrical in the sense intended in this application and as explained above. On the other hand, the permanent-magnet poles 16A are magnetically asymmetrical since they have a protrusion 16' on the side facing against the direction of rotation of the rotor, said protrusion being caused by the poles 16A on this side having narrower breadth, i.e. dimension parallel to the axis of rotation 12A, than over the main part of the poles, see FIG. 1B. The part of the permanent-magnet poles 16A with full breadth may be said to constitute a main pole part, while the narrower protrusion may be said to constitute an auxiliary pole part, designated in the figures by 16'.

The reluctance poles 18A on the rotor 12 are also asymmetrical in corresponding manner since they are provided on their leading or counterclockwise end, the side or end directed in the direction of rotation, with a protrusion 18' (auxiliary pole part) having a breadth less than that of the main part (main pole part) of the poles, see FIG. 1B.

As is evident from the above, the asymmetry in the poles can be achieved in ways other than those just described. In one example of an alternative method each pole has the same breadth across its entire circumferential and axial dimensions, but at one end the pole surface is offset radially inwards so that the air gap is wider at this side than over the main part of the pole.

FIG. 1B shows a developed view of the pole group 13 of the stator 11 and a portion of the pole row of the rotor 12 in FIG. 1A as viewed from within the air gap and with the rotor poles displaced axially in relation to the stator pole group. The parallel dash-dot lines R and S indicate the direction of the relative movement between rotor and stator, while the dash-dot line L perpendicular thereto represents the centre line between the stator poles. The position of the stator and rotor poles in relation to each other corresponds to the relative position shown in FIG. 1A and is the stable position the rotor assumes in relation to the stator when current is supplied to the winding 15 so that the reluctance poles 15S tend to keep the rotor poles 18A in an attracted or indrawn position with the main pole parts of the rotor poles opposite to the stator reluctance poles.

When current is no longer supplied to the winding coils 17 in this rotor position, then only the permanent-magnetic flux from the permanent-magnet poles 16A acts on the rotor 12 to pull it further in the direction of the starting position, i.e. counterclockwise.

FIG. 1C shows the rotor moved from the indrawn position in FIG. 1A to in the starting position, also called detent or parking position, in which one rotor pole 18A is magnetically aligned with the permanent-magnet pole 16A and thus is in a position in which the flux linking the two poles is at a maximum. A portion of the auxiliary pole part 18' on the leading end of the rotor pole extends in the counterclockwise direction beyond the permanent-magnet pole 16A and the trailing end of the rotor pole is positioned opposite to the auxiliary pole part 16' of the permanent-magnet pole. This is also shown in FIG. 1E.

From FIG. 1C is apparent that in the starting position of the rotor there is no favourable flux path along which the flux of the permanent-magnet pole 16A can pass diametrically to the opposite side of the stator as in the prior art motors. To provide a return path for the permanent-magnet flux back to the permanent-magnet pole 16A, the stator 11 is provided with a pair of diametrically opposite ferromagnetic auxiliary pole pieces 20 positioned between the two pole groups 13 and 14 such that in the starting position they are opposite to two diametrically opposite rotor poles 18A. These auxiliary pole pieces 20 have pole faces on the imaginary cylindrical surface containing the pole faces of the stator poles. As is shown by the flux pattern in FIG. 1C, the flux from the permanent-magnet pole 16A is split mainly in two return paths extending through the auxiliary pole pieces 20 and passed through the upper portion of the stator 11 back to the south-pole side of the permanent-magnet pole.

The stator pole pieces 20 may be integrally formed in the stator 11 or they may be separate pole pieces which are attached to the stator after the winding coils 17 have been inserted.

As is shown in FIG. 1A, in the indrawn position the auxiliary pole part 18' of one of the rotor poles 18A, the upper right rotor pole, extends up to the auxiliary pole part 16' of the permanent magnet 16A and preferably even overlaps this auxiliary pole part 16' slightly. This relative position of the rotor reluctance pole and the permanent-magnet pole is a position in which the magnetic attraction force the permanent-magnet pole 16A exerts on the rotor pole, and hence the counterclockwise torque applied to the rotor 12 by the permanent-magnet pole 16A, is at or near its maximum, the winding coils being currentless.

At the same time, the spacing of the upper left rotor pole 18A from the permanent-magnet pole 16A is substantial so that the permanent-magnet pole 16A only applies an insignificant clockwise torque to the rotor.

Accordingly, the net counterclockwise torque applied to the rotor by the permanent-magnet pole 16A is capable of forcefully jerking the rotor counterclockwise from the indrawn position and turn it through an angle corresponding to one-half of the rotor pole pitch to bring the rotor poles 18A to the starting position (pull-in movement).

Throughout the pull-in movement of the rotor from the indrawn position to the starting position the magnetic flux between the permanent-magnet pole 16A and the rotor pole 18A which it overlaps and with which it interacts increases steadily with increasing pole overlap so that a counterclockwise torque is exerted on the rotor until the starting position has been reached.

FIG. 1E also includes a graph representative of an exemplary embodiment of the motor shown in FIGS. 1A to 1D and shows the pull-in force F acting between the permanent-magnet pole 16A and the rotor reluctance pole 18A versus the overlap position d of the leading end 18" of the rotor reluctance pole 18 during the pull-in movement from the indrawn position to the starting position. In the right-hand portion of FIG. 1E the indrawn position of the rotor reluctance pole 18A is shown in dash-dot lines.

The graph shows the pull-in force F acting on the rotor reluctance pole 18A for different amounts of overlap (positive and negative) between the auxiliary pole part 16' of the permanent-magnet pole 16A and the auxiliary pole part 18' of the rotor reluctance pole 18A in the indrawn position.

From FIG. 1E it is apparent that if the overlap in the indrawn position is −1 mm, that is, if the leading end 18" of the reluctance pole 18A is spaced 1 mm in the negative or clockwise direction from the end 16" of the permanent-magnet pole 16A, the pull-in force is quite small. If the leading end 18" is opposite the end 16" of the auxiliary pole part 16' of the permanent-magnet pole 16A (zero overlap), the pull-in force is substantially greater, and with a positive overlap of about 1 mm, the pull-in force on the auxiliary pole part 18A' is at or near its maximum where it is three to four times the pull-in force for a negative overlap of about 1 mm. The asymmetry of the permanent-magnet pole 16A in conjunction with the asymmetry of the rotor reluctance pole 18A thus produces a dramatic increase of the initial value of the pull-in force in comparison with the case where only the rotor reluctance pole is asymmetrical as in the motor disclosed in WO92/12567. This increase of the pull-in force broadens the field of application of the motor according to the invention.

From FIG. 1E it is also apparent that as the overlap gradually increases during the pull-in movement, the pull-in force remains approximately constant during the first portion of the pull-in movement, namely until the main pole parts begin to overlap. During the continued pull-in movement the pull-in force will first increase and then gradually drop to zero as the reluctance pole 18A reaches the starting position.

Moreover, FIG. 1E shows that during the counterclockwise pull-in movement of a rotor reluctance pole 18A from the indrawn position to the starting position, the permanent-magnet pole 16A will exert a substantial attraction force on the rotor reluctance pole throughout a circumferential distance which is greater than the circumferential dimension of the permanent-magnet pole 16A: from a position in which the leading end 18" is opposite to or only slightly spaced in the clockwise direction from the end 16" of the auxiliary pole part 16' of the permanent-magnet pole 16A up to a point in which the leading end 18" is well past the permanent magnet pole.

When the winding coils 15 are again energized with the rotor poles in the starting position, the auxiliary pole parts 18' of all four rotor poles 18A will therefore be near a stator reluctance pole 15S ahead of it as seen in the direction of rotation of the rotor. On the other hand, the spacing of the trailing end of each rotor pole from the stator reluctance pole behind it is substantial. The magnetic attraction in the counterclockwise direction between the stator reluctance pole 15S and the leading end 18" of the rotor reluctance pole 18A behind it will thus be heavily predominant over the magnetic attraction in the clockwise direction exerted on the trailing end of the same rotor pole by the next stator reluctance pole (i.e. the stator reluctance pole behind the rotor pole).

Accordingly, the net torque applied to the rotor by the stator reluctance poles 15S will act in the counterclockwise direction and will be high so that the motor will be capable of starting against a considerable load. Again, the magnetic flux produced as a consequence of the energization of the winding coils 17 opposes the magnetic flux produced by the permanent-magnet pole 16A so that the permanent-magnet pole does not substantially counteract the movement from the starting position.

The embodiments illustrated in the other figures are described only insofar as they differ from the embodiment shown in FIGS. 1A–1D. The same designations are used throughout for all embodiments with the suffix letters A or S indicating asymmetrical or symmetrical. Unless otherwise stated, "symmetry" and "asymmetry" with regard to the poles relate to their magnetic symmetry or asymmetry rather than their geometrical symmetry or asymmetry (which may or may not correspond to the magnetic symmetry or asymmetry).

The motor in FIGS. 2A and 2B differs from the motor in FIGS. 1A–1C only with regard to the design of the stator 11 and the number of poles of the rotor 12.

More specifically, the stator has only one pole group 13, which is identical with the pole group 13 of FIGS. 1A–1D except that the permanent-magnet pole 16S is magnetically symmetrical and one of the reluctance poles is asymmetrical.

Moreover, the stator 11 itself forms a circumferentially extended auxiliary pole 20 diametrically opposite to the pole group. This auxiliary pole 20 subtends an angle of about 180 degrees so that at least two of the five reluctance poles 18A of the rotor are always opposite the auxiliary pole.

The motor in FIGS. 3A and 3B differs from the motor in FIGS. 2A to 2C only in that both reluctance poles 15S of the stator are symmetrical as in FIG. 1A and the permanent-magnet pole 16 is asymmetrically positioned with respect to the two reluctance poles 15S and in that the rotor reluctance poles 18S are provided with auxiliary pole parts 18' both at the leading end and the trailing end. The circumferential dimension of these auxiliary pole parts 18' is smaller than that of the auxiliary pole parts in the preceding embodiments.

The permanent-magnet pole 16 is connected to an actuating mechanism 21 including a lever 22. In operation of the motor, the permanent-magnetic pole 16 is stationary in a selected off-centre position, such as that shown in full lines near the left reluctance pole 15S, but by shifting the lever 21 downwards from the position shown in full lines the permanent-magnet pole can be shifted to a corresponding off-centre position, indicated in dash-dot lines in FIGS. 3A and 3B, on the other side of the line of symmetry between the reluctance poles 15S to reverse the preferential direction of rotation of the rotor.

Accordingly, in this embodiment the magnetic asymmetry in the pole system of the motor is achieved through asymmetry within the pole group 13, resulting from an asymmetical positioning of the permanent-magnet pole, rather than through asymmetry of one or more of the individual poles of the pole group.

In the motor shown in FIG. 4, the stator 11 likewise comprises only one pole group 13 similar to that shown in FIGS. 1A to 1E, except that the permanent-magnet pole is symmetrical. However, in this case the stator 11 is a so-called segment stator and accordingly only subtends a portion of the rotor circumference. The end portions of the stator 11 form auxiliary pole pieces 20 providing return paths for the magnetic flux from the reluctance poles 15S and the permanent-magnet pole 16S.

FIGS. 5A and 5B show a motor in which the rotor 12 resembles the rotor 12 in FIG. 2A. In this case the stator 11 is only provided with permanent-magnetic poles, namely a group 13 of four evenly spaced asymmetrical permanent-magnet poles 16AN, 16AS of alternating polarities N and S on their sides facing the air gap 19, the pole pitch being one-half of the rotor pole pitch. Moreover, in this motor the winding coils 17 are supplied with current pulses of alternating polarity.

Apart from the pole arrangement the stator 11 in FIG. 5A resembles the stator 11 in FIG. 2A and it accordingly comprises an auxiliary pole 20 which is diametrically opposite to the pole group 13 and subtends an angle of about 180 degrees.

Magnetical asymmetry on the stator pole group 13 of the motor in FIG. 5A can be provided by displacing, for example, both permanent-magnet poles 16AS circumferentially in one direction or the other from the illustrated central position to an off-centre position relative to the other permanent-magnet poles 16NS without changing the spacing of the the permanent-magnet poles 16AS from one another.

FIGS. 6A to 6C show a motor according to the invention which may be regarded as a two-phase version of the motor shown in FIGS. 2A and 2B. Its stator 11 comprises two diametrically opposite pole groups 13U and 13V which are identical and substantially similar to the pole group 13 of FIG. 2A. Each pole group comprises a pair of symmetrical reluctance poles 15S and a symmetrical permanent-magnet pole 16S positioned centrally between the reluctance poles and is associated with a winding coil 17U and 17V belonging to different phases U and V of the stator winding.

The winding coils 17U and 17V are energized with pulsed direct currents in phase opposition.

Moreover, the stator has a pair of diametrically opposite auxiliary pole pieces 20 which are positioned between the pole groups.

The rotor 12 is provided with seven uniformly spaced asymmetrical reluctance poles 18A. When the reluctance poles 15S of the upper pole group 13U are magnetically aligned with a pair of adjacent rotor poles 18A as shown in FIG. 6A so that these rotor poles are in an indrawn position, the permanent-magnet pole 16S of the opposite pole group 13V is magnetically aligned with another rotor pole 18A. No other rotor pole is aligned with a stator pole. More generally, whenever a reluctance pole of a pole group on the stator is magnetically aligned with a rotor pole, no other rotor pole is magnetically aligned with a reluctance pole of a different pole group, and whenever a permanent-magnet pole of a pole group on the stator is magnetically aligned with a rotor pole, no other rotor pole is magnetically aligned with a permanent magnet pole of a different pole group.

FIG. 6C shows the rotor turned from the position of FIG. 6A through an angle corresponding to one-half of the rotor pole pitch, so that a rotor pole 18A is magnetically aligned with the permanent-magnet pole 16S of the upper pole group 13U. This figure also shows the flux pattern which is set up when the winding coil 15U of the upper pole group 13U is energized with the rotor in the said turned position.

In the motor shown in FIGS. 6A to 6C, the permanent-magnet poles 16S may also be placed in an off-centre or asymmetrical position as described with reference to FIGS. 3A, 3B.

As is apparent from the drawings, whenever a reluctance pole or permanent-magnet pole of a pole group on the stator is magnetically aligned with a rotor pole, the auxiliary pole means 20 presents to the flux passing from that stator pole to the rotor pole the most favourable path for returning the flux to the stator.

Combinations of poles on the stator and the rotor other than those specifically shown in the drawings and described here are also possible within the scope of the invention.

Besides the pole arrangements illustrated and described above, the following list (which is not exhaustive) includes examples of pole arrangements falling within the scope of the invention.

I. Symmetrical Reluctance Poles on the Rotor
A. Only permanent-magnet (PM) poles on the stator
  1. Symmetrical permanent-magnet poles arranged in asymmetrical pole row
  2. Asymmetrical PM poles
B. Reluctance poles and PM poles on the stator
  1. Asymmetrically placed poles in a pole group FIG. 3
  2. Symmetrically placed poles in pole groups
  2.1 Symmetrical reluctance poles
    a. Asymmetrical PM poles
  2.2 Asymmetrical reluctance poles
    a. Symmetrical PM poles
    b. Asymmetrical PM poles II. Asymmetrical Reluctance Poles on the Rotor
A. Only PM poles on stator
  1. Symmetrical PM poles
  2. Asymmetrical PM poles FIG. 5
B. Reluctance poles and PM poles on the stator
  1. Asymmetrically placed poles in a pole group
  2. Symmetrically placed poles in pole groups
  2.1 Symmetrical reluctance poles
    a. Symmetrical PM poles FIGS. 4, 6
    b. Asymmetrical PM poles FIG. 1
  2.2 Asymmetrical reluctance poles
    a. Symmetrical PM poles FIG. 2
    b. Asymmetrical PM poles FIGS. 7A to 7D are views corresponding to FIGS. 1B, 2B, 3B etc. and serve to further elucidate the concept of magnetically symmetrical and asymmetrical positioning of a permanent-magnet pole between a pair of reluctance poles on the stator. These four figures show four different shapes of the permanent-magnet pole together with a stator and rotor reluctance pole combination which is the same in all figures and similar to that in FIGS. 1A and 1B. All four figures show the rotor reluctance poles 18A in the starting position, that is, magnetically aligned with the permanent-magnet pole 16S (FIG. 7A) or 16A (FIGS. 7B to 7D), the winding associated with the stator pole group being currentless.

In the starting position the force exerted on the rotor reluctance pole 18A by the permanent-magnet pole 16A or 16S is zero in the circumferential direction but in response to any deviation of the rotor pole from the aligned position the attraction force between the permanent-magnet pole and the rotor pole will develop a circumferential component tending to return the rotor pole to the starting position.

In FIG. 7A, which is included for comparison and shows a symmetrical pole configuration corresponding to that shown in WO92/12567, the permanent-magnet pole 15S completely overlaps the main pole part of the rotor reluctance pole 18A. FIGS. 7B to 7D show different stator pole configurations according to the invention which are asymmetrical by virtue of asymmetry of the permanent-magnet pole. In FIG. 7D the stator pole group consisting of the poles 15S and 16A is asymmetrical both by virtue of pole asymmetry of the permanent-magnet pole 16A and by virtue of a slightly asymmetrical positioning of that pole (towards the left stator reluctance pole 15S), resulting in a slightly asymmetrical aligned position of the rotor reluctance pole 18A between the two stator reluctance poles 15S.

Magnetic asymmetry on the stator may be achieved also when all stator poles are permanent-magnet poles of alternating polarity. The permanent-magnet poles of one polarity may be collectively displaced in either circumferential direction from the central position between adjacent permanent-magnet poles of the other polarity, the poles within each set of like-polarity poles still being substantially evenly spaced-apart.

In all embodiments illustrated in the drawings, the stator and the rotor are laminated from thin electric steel plates as is indicated in FIG. 1D (where the thickness of the plates is heavily exaggerated for clearness of illustration).

In those motors which have reluctance poles both on the stator and on the rotor, the portions of the plates which form the stator reluctance poles or, every second stator plate 11A is slightly reduced such that the curved plate edges 11B facing the air gap are offset radially outwardly relative to the neighbouring plates, see FIG. 1A and the lower portion of FIG. 1D. In other words, only every second plate 11C extends up to the air gap while the intervening plates 11A end short of the air gap.

As described in WO92/12567, this thinning out of the plate stack at the pole face of the reluctance poles serves to ensure that the change of the flux in the air gap between the stator and rotor reluctance poles that takes place as the rotor reluctance poles move past the stator reluctance poles is proportional to the change of the pole overlap area. In other words, they serve to ensure that the flux density in the pole overlap area is substantially constant as long as the flux change will not be limited by magnetic saturation in a different region of the magnetic circuit so that the torque developed by the interaction of the poles will be as uniform as possible.

Magnetically, the effect of the reduction or shortening of the reluctance pole portion of every second plate is a 50% lowering of the averaged value of the saturation flux density across the pole face serving the purpose of reducing the magnetic induction swing (the interval within which the flux density varies over an operating cycle of the motor) in the bulk of the laminated stack, where the predominant part of the iron losses arise.

In accordance with a modified technique for thinning out the reluctance poles at the pole faces which is suitable for motors running at elevated operating frequencies, all plates, or the plates which extend up to the air gap, are provided with recesses which constrict the cross-sectional area of the plate presented to the magnetic flux in the pole and thereby contribute to a lowering of the flux density for which the pole becomes magnetically saturated at the pole face.

The recesses should be distributed substantially uniformly over the cross-section of the plate. They may take the form of holes, i.e. openings which are not open to the air gap, or they may take the form of openings which communicate with the air gap, preferably via narrow passages. Wide passages are undesirable because they give rise to eddy currents in the faces of the reluctance poles of the other motor part.

Instead of stacks of thin laminations or iron plates a composite body of iron powder or flakes embedded in a plastic matrix may be used.

Alternative Embodiments

Motors according to the invention comprise pole groups with windings and may be shaped for rotary or linear movement.

The rotating motors may have

1. An air-gap surface that is disc-shaped or cylindrical, conical etc., in principle any shape of surface that a generatrix rotating about a stationary axis can describe.

2. External rotor.

3. The difference between the pole number in the stator and rotor, respectively may be arbitrary, e.g. in the case of segmented stator(s).

4. In a motor with a cylindrical air-gap surface and an internal rotor, several pole groups may be arranged so that they are axially spaced. A motor may consist of several such "motor discs". These discs may have individually closed flux paths or may be interconnected by axially directed flux paths. Examples of such an arrangement can be found in WO90/02437. The various "motor discs" can be magnetized by common coils for two "motor discs" for instance.

5. For motors with axial flux connection between "motor discs", the winding may consist of a cylinder coil surrounding the axis of rotation (an example of such an arrangement is shown in WO90/02437). In this case, for instance, the rotating part may contain the pole types which would otherwise have been stationary, and vice versa.

6. The shape and/or distribution of the poles in a motor, e.g. the reluctance poles, may be chosen so that noise and vibration generated by varying magnetic forces between stator and rotor are reduced as far as possible. Examples of known measures of this type are skewed pole edges or a slightly uneven distribution of the poles along the periphery of the rotor or a certain difference between the pole pitch in a pole group on the stator and the pole pitch on the rotor. Various measures can also be combined.

7. In motors with two, or some other even number of reluctance poles in each group on the stator and no permanent-magnet poles on the stator, the soft-magnetic stator yoke part which in the embodiments shown runs in the middle of the pole group, can be eliminated without affecting the magnetic function of the motor. The mechanical function of said stator yoke parts as spacers may be replaced with non-magnetic spacer means.

8. It will be understood that the coils shown in FIGS. 1–6 for magnetizing the pole groups can also be arranged differently, e.g. as coils of transformer type surrounding the yokes between the pole groups. The stator yoke may also be divided thereby enabling pre-wound coils to be used. Alternatively, for a yoke shaped as a section of a toroid, the coil may be sectionally toroid-wound around the yoke. It may also be economically advantageous in small motors, for instance, to replace two yokes that connect two pole groups together, with a single yoke with doubled cross-sectional area and have a single coil surrounding the yoke. Such arrangements are known in small shaded-pole motors and DC motors.

10. To enable the use of only a single electronic switching element in motors supplied with current pulses of a single polarity, field energy can be returned to the DC source by means of a feedback winding wound in parallel with the operating winding, as described in WO90/02437.

What is claimed is:

1. A self-starting brushless electric motor, comprising
   a ferromagnetic first motor part including a plurality of first poles arranged in spaced-apart relation in a first pole row,
   a ferromagnetic second motor part including a plurality of second poles arranged in spaced-apart relation in a second pole row,
   a bearing supporting the first motor part and the second motor part for relative movement with the first pole row confronting the second pole row across an air gap, and
   a winding on the first motor part comprising for each winding phase a first winding coil arranged in association with a first pole group of the first pole row to produce a magnetic field linking the poles of the first pole row and the second pole row through said first pole group upon energization of said first winding coil, the first pole row and the second pole row constituting a pole system comprising first-type and second-type poles, a first-type pole being a reluctance pole and a second-type pole being a permanent-magnet pole which is polarized transversely to the air gap, at least one of the first poles and second poles including a magnetic asymmetry providing a preferential relative direction of movement of the motor parts upon energization of the winding, wherein the motor parts have magnetically unbalanced relative positions in which a first pole of the first pole row is magnetically aligned with a second pole of the second pole row, and there is no other pole on the first motor part which is polarized oppositely to the first pole of the first pole row, which belongs to the same winding phase as the first pole of the first pole row, and which is also aligned with any other pole of the second pole row, wherein the first motor part includes an auxiliary pole adjacent to the second motor part, and wherein said auxiliary pole in said unbalanced relative positions of the motor parts presents a path for returning to the first motor part magnetically unbalanced flux which is passed to the second motor part from said first-mentioned aligned pole of the first pole row.

2. A motor as claimed in claim 1, wherein said first pole group has at least one magnetically symmetrical first-type pole and a magnetically asymmetrical second-type pole (FIGS. 1, 3, 5).

3. A motor as claimed in claim 1, wherein said first pole group comprises two first-type poles and a second-type pole positioned therebetween, the spacing of said first-type poles corresponding to the spacing of the poles of the second pole row (FIGS. 1–4, 6).

4. A motor as claimed in claim 3, wherein the first-type poles of said first pole group are symmetrical and the second-type pole is polarized in the direction opposing the magnetic field of the winding coil and mounted in an asymmetrical which is asymmetrical with respect to the first-type poles, and the second pole row comprises a plurality of substantially evenly spaced first-type poles (FIG. 3).

5. A motor as claimed in claim 4, wherein the second-type pole is displaceable along the first pole row from said asymmetrical position to a corresponding asymmetrical position on the opposite side of a line of symmetry between the first-type poles and in that the first-type poles of the second pole row comprise a main pole part and an auxiliary pole part at each end of the main pole part (FIG. 3).

6. A motor as claimed in claim 1, wherein the second pole row comprises a plurality of substantially evenly spaced magnetically asymmetrical first-type poles (FIGS. 1–6).

7. A motor as claimed in claim 1, wherein said first pole group comprises a pair of second-type poles polarized in opposite directions and the second pole row comprises a plurality of substantially evenly spaced first-type poles (FIG. 5).

8. A motor as claimed in claim 7, wherein said first pole group comprises at least one additional one of the second type poles polarized in opposite directions relative to any adjacent pole.

9. A motor according to claim 1, comprising magnetically asymmetrical poles further comprising a main pole part and an auxiliary pole part which projects from the main pole part in the preferential relative direction of movement of the respective motor part.

10. A motor according to claim 9, wherein the auxiliary pole parts are of a length, as measured along the pole rows, such that when any pole on one of the two motor parts is magnetically aligned with a pole on the other motor part, the auxiliary pole part of at least one of the magnetically asymmetrical poles on one of the motor parts extends at least to the vicinity of an adjacent pole on the other motor part and preferably slightly overlaps said adjacent pole.

11. A motor as claimed in claim 1, wherein the first pole row comprises at least one additional pole group and an additional winding coil associated therewith and forming part of the same winding phase as said first winding coil, said auxiliary pole being positioned between said first pole group and said additional pole group (FIG. 1).

12. A motor as claimed in claim 1 wherein said auxiliary pole comprises a pair of auxiliary pole members positioned on opposite sides of said first pole group.

13. A motor according to claim 1 wherein the first motor part is a stator and the second motor part is a rotor journalled for rotation relative to the stator.

14. A motor as claimed in claim 13, characterized by an additional pole group which is diametrically opposite to said first pole group and comprises a pair of spaced-apart first-type poles, the spacing of said first-type poles corresponding to that of the poles of the second pole row (FIG. 1).

15. A motor according to claim 13, wherein said auxiliary pole is diametrically opposite to said first pole group and extends circumferentially along the air gap over an angular distance corresponding to at least twice the pole pitch of the rotor (FIGS. 2, 3, 5).

16. A motor according to claim 1, wherein the winding is a polyphase winding comprising said first winding coil as a first-phase winding coil and an additional winding coil as a second-phase winding coil, and wherein the first pole row comprises a second pole group associated with said second-phase winding coil, said second pole group being spaced from said first pole group such that only one at a time of like-type poles of said first and second pole groups is magnetically aligned with a pole of the second pole row.

17. A motor according to claim 1, wherein at least one of the first row and the second row is magnetically asymmetrical, whereby the unbalanced flux is produced.

18. A motor according to claim 17, wherein the unbalanced flux is asymmetrical about a symmetry axis of the motor.

19. A motor according to claim 1, wherein there is exactly one first pole of the first pole row.

* * * * *

UNITED STATES PATENT AND TRADEMARK OFFICE
CERTIFICATE OF CORRECTION

PATENT NO.    : 6,075,774
DATED         : June 13, 2000
INVENTOR(S)   : Lorenz et al.

It is certified that error appears in the above-identified patent and that said Letters Patent is hereby corrected as shown below:

The title page showing the illustrative figure should be replaced and substituted with the attached title page.

Columns 1-16, of the specification and claims, should be deleted and substituted with the new specification and claims, columns 1-16 as per attached.

Signed and Sealed this

Twenty-third Day of December, 2003

JAMES E. ROGAN
*Director of the United States Patent and Trademark Office*

United States Patent [19]
Lorenz et al.

[11] Patent Number: 6,075,774
[45] Date of Patent: Jun. 13, 2000

[54] METHOD AND DEVICE FOR GENERATING A FRAME CHECK SEQUENCE

[75] Inventors: Gary D. Lorenz, Acton; Charles Lee, Ashland, both of Mass.

[73] Assignee: 3Com Corporation

[21] Appl. No.: 08/972,284

[22] Filed: Nov. 18, 1997

[51] Int. Cl.$^7$ .............................. H04J 1/16; H03M 13/00
[52] U.S. Cl. .......................................... 370/242; 714/758
[58] Field of Search ...................................... 370/241, 242, 370/252, 476, 506, 511, 514, 470, 472, 474; 714/758, 776, 781, 807, 48, 52, 774, 801

[56] References Cited

U.S. PATENT DOCUMENTS

| | | |
|---|---|---|
| 4,712,215 | 12/1987 | Joshi et al. . |
| 5,553,085 | 9/1996 | Lauck et al. ........................... 714/752 |
| 5,619,516 | 4/1997 | Li et al. ........................... 714/807 |
| 5,689,518 | 11/1997 | Galand et al. ........................... 714/752 |
| 5,912,881 | 6/1999 | Glaise et al. ........................... 370/252 |
| 5,951,707 | 9/1999 | Chirstensen et al. ........................... 714/752 |
| 6,014,767 | 1/2000 | Glaise ........................... 714/776 |

FOREIGN PATENT DOCUMENTS

| | | |
|---|---|---|
| 0 614 294 | 9/1994 | European Pat. Off. . |
| WO 94/15407 | 7/1994 | WIPO . |

*Primary Examiner*—Chau Nguyen
*Assistant Examiner*—Chiho Andrew Lee
*Attorney, Agent, or Firm*—McGlew and Tuttle, P.C.

[57] ABSTRACT

A frame conveyed across the network is divided into a plurality of segments with an identical number of bits. All of the bits of a segment are received simultaneously, with each segment of the frame being received sequentially. Very often, the number of bits in the entire frame, will not be an integer multiple of the number of bits in the segment. Therefore the bits of the frame can be unevenly divided into the plurality of segments. The present invention detects the number of bits from the frame that are present in each of the segments, or at least the number of bits of the frame present in the last segment. An FCS function is used to create a segment FCS function which operates on all the bits of a segment at one time. The original FCS function is preferably an 8 bit function, which combines a present 8 bit word with the FCS calculated for previous 8 bit word in order to generate a new FCS for the present 8 bit word and all previous 8 bit words. By combining all the equations that would normally be required for all the 8 bit words in a segment, a segment FCS function is created which removes many redundant terms. Each segment is combined with a previous intermediate or segment FCS, to create a new intermediate FCS for the present segment and all previous segments. Subsegment FCS functions are also determined for each of all possible numbers of frame bits that are possible in a segment. The number of frame bits is detected and the corresponding subsegment FCS function is used.

19 Claims, 6 Drawing Sheets

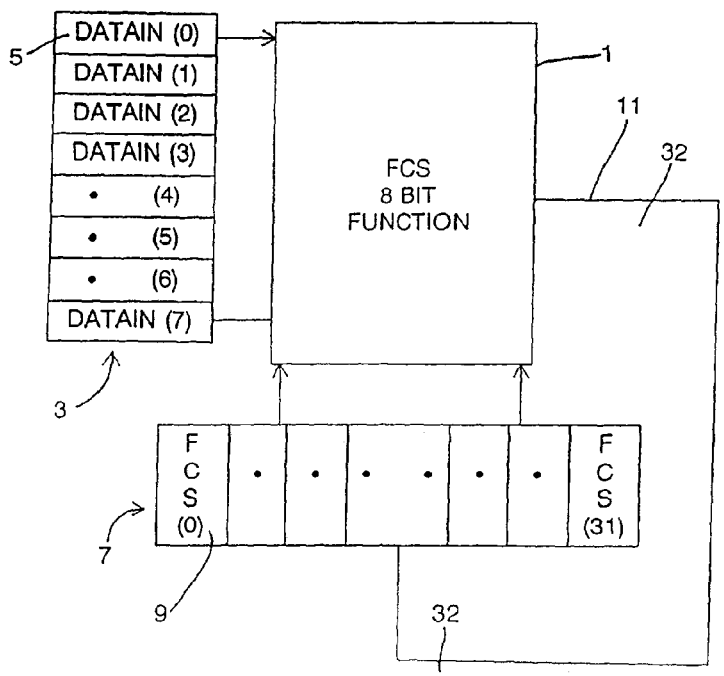

6,075,774

METHOD AND DEVICE FOR GENERATING A FRAME CHECK SEQUENCE

FIELD OF THE INVENTION

The present invention relates to computer networks where calculations are performed on the individual bits of data to determine if an error has occurred during transmission of the data from one device to another. In particular, the present invention relates to a particular method and device for calculating a Frame Check Sequence (FCS) for a frame transmitted across a computer network.

BACKGROUND OF THE INVENTION

Many different types of error checking methods are known. One of the earliest methods is known as a parity check. This requires that each frame of data transmitted across the computer network must have an even number of bits representing the "1" state. All frames sent across the computer network with this system have a parity bit. If a transmitter was to send a frame that had an odd number of 1's, the transmitter would set the parity bit to 1, in order to have the total number of 1's in the frame be equal to an even number. If the transmitter was to send a frame that already had an even number of 1's, the parity bit was set to zero.

When a frame was received, the receiver would count the number of 1's in the frame. If the number of 1's was odd, the receiver knew an error had occurred. If the number of 1's in the received frame was even, the receiver assumed the frame had been received correctly.

While this method of parity checking provides detection of many types of errors, it will not detect all errors occurring during the transmission of a frame. More sophisticated methods have become known to detect a greater number of the different types of errors that are possible. These methods are known as Frame Check Sequences (FCS), and specific information for the type of FCS used in the present invention can be found in the American National Standard for Advanced Data Communication Control Procedures (ADCCP), ANSI X3.66-1979 (Section 12 & Appendix D), and Telecommunications; Synchronous Bit Orientated Data Link Control Procedures (Advanced Data Communications Control Procedures), FED-STD-1003A, available from GSA specification section, 7&D Street, S.W. Washington D.C. 20407, hereby incorporated by reference. These standards analyze the data in a frame, and generate a 32 bit FCS value. This FCS value is then either added to the frame, or checked with the FCS value already present in the frame.

These standards rely on data being transmitted in 8 bit words also known as bytes. All calculations are therefore done with 8 bits of the frame at a time.

Networks are being required to handle ever increasing amounts of data, with faster transmission of data being always beneficial. The calculating of the FCS, is required for each frame that is transmitted and received, and is very important to the operation of the network. The FCS is a significant burden and hinderance to increasing the speed of transmitting large amounts of data over a network.

SUMMARY AND OBJECTS OF THE INVENTION

It is a primary object of the present invention to provide a method and apparatus for generating an FCS in a computer network capable of transmitting data at high data rates.

The present invention accomplishes this objective by dividing the frame conveyed across the network into a plurality of segments, where each segment has an identical number of bits. The number of bits of each segment is greater than 8, and is preferably an integer multiple of 8. All of the bits of a segment are received simultaneously, with each segment of the frame being received sequentially. In this way several bytes can be transmitted and received simultaneously thus greatly increasing the data rate. Very often, the number of bits in the entire frame, will not be an integer multiple of the number of bits in the segment. Therefore the bits of the frame can be unevenly divided into the plurality of segments. The present invention detects the number of bits from the frame that are present in each of the segments, or at least the number of bits of the frame present in the last segment.

An FCS function which operates on 8 bits at a time, is used to create a segment FCS function which operates on all the bits of a segment at one time. The original FCS function is preferably an 8 bit function, which combines a present 8 bit word with the FCS calculated for the previous 8 bit word in order to generate a new FCS for the present 8 bit word and all previous 8 bit words. By combining all the equations that would normally be required for all the 8 bit words in a segment, a segment FCS function is created which removes many redundant terms, and which causes many terms to cancel out. By operating on a complete segment at a time, many redundant calculations are avoided and this further increases the speed for calculating an FCS. Each segment is combined with a previous intermediate or segment FCS, to create a new intermediate FCS for the present segment and all previous segments. This combining is continued until the last segment, with the final FCS calculated being the frame FCS.

Speed is increased, not only due to the parallel processing of several 8 bit words at one time, but also due to a more efficient FCS function which removes redundant terms and causes terms to cancel out. Thus less calculations need to be done in the present invention, than would need to be done when operating on 8 bits at a time.

A plurality of sub segment FCS functions are also provided. Each of these functions operate on a different number of bits of a segment. In the preferred embodiment, the number of bits in the segment, and the number of bits in the frame, are an integer multiple of 8. Therefore the number of frame bits in the segment will also be an integer number of 8. Sub segment FCS functions are created in the same manner as the segment FCS function, but for each of the integer multiples of 8 possible in the segment.

The number of frame bits in the segment are detected, and the corresponding FCS function operates on the segment. Alternatively, all of the FCS functions can operate simultaneously on the segment, and the output of the FCS function corresponding to the number of frame bits in the segment, is used. Outputs of all other FCS functions are ignored.

The FCS calculated for the frame, is then either checked with the FCS present in the frame, to determine if there was an error during transmission of the frame, or if the frame does not have an FCS, the FCS is added to the frame. The generation of the FCS of the present invention is preferably used with FDDI and Ethernet.

The various features of novelty which characterize the invention are pointed out with particularity in the claims annexed to and forming a part of this disclosure. For a better understanding of the invention, its operating advantages and specific objects attained by its uses, reference is made to the accompanying drawings and descriptive matter in which preferred embodiments of the invention are illustrated.

DESCRIPTION OF THE PREFERRED EMBODIMENTS

Figure 1:
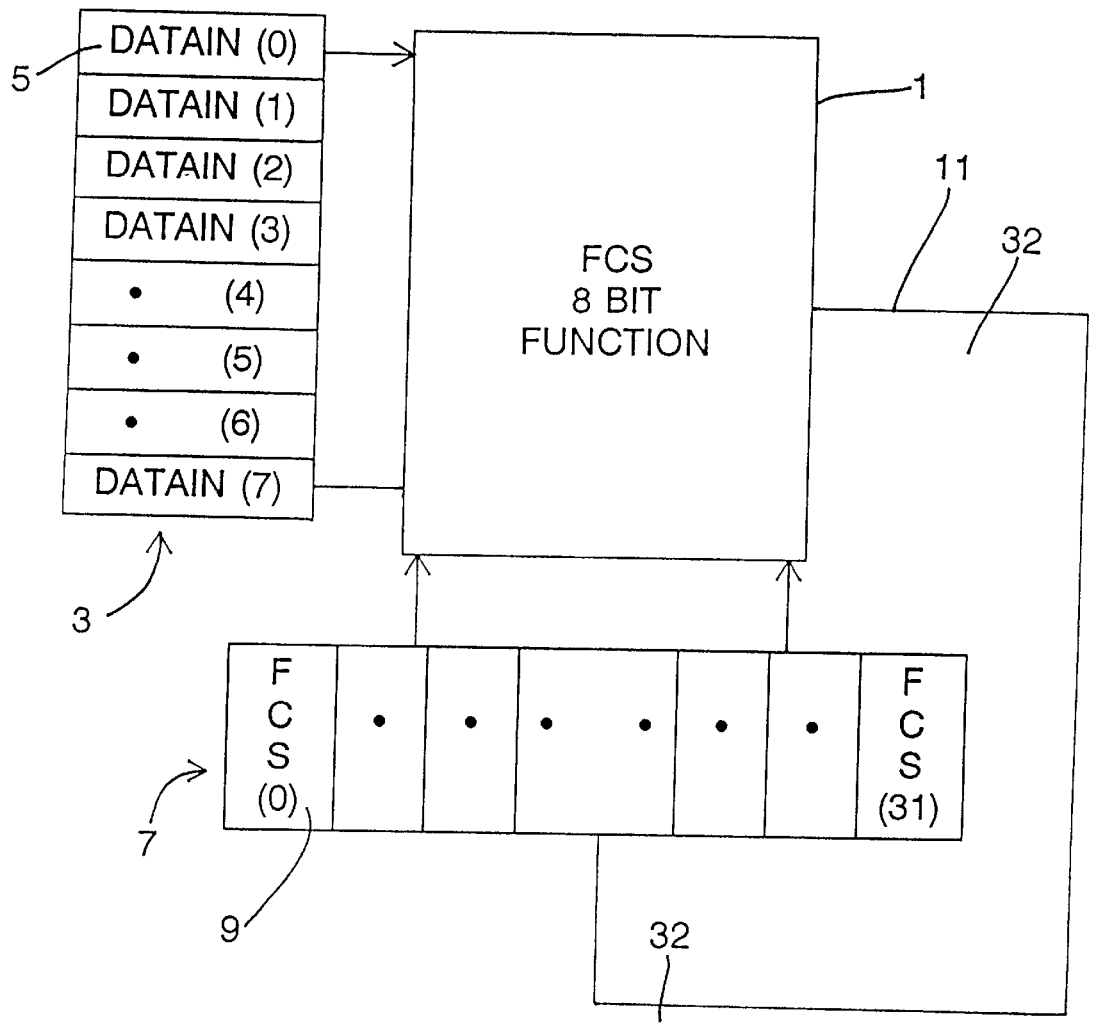
FIG. 1 is a schematic diagram of the operation of an 8 bit FCS function.

Referring to the figures, and especially FIG. 1, the present invention is based on an 8 bit FCS function 1. The FCS 8 bit function 1 receives an 8 bit data word 3 which has individual datain bits 5. The 8 bit FCS function 1 also cooperates with an FCS memory or storage 7 which also has individual FCS bits 9. There are 8 datain bits, and the FCS is 32 bits. The 8 bit FCS function 1 receives the datain bits 5 and the FCS bits 9 as inputs, and then combines the inputs to form a new FCS from port 11. This new FCS value is placed into FCS storage 7. When the next data word is available, the 8 bit FCS function 1 combines the new data word 3 with the new FCS value 7 and calculates another new FCS value on port 11. The new FCS value is then the FCS value for the present data word, and the previous data word. The 8 bit FCS function 1 continues to calculate FCS values for all of the data words of the frame. Once all the data words of the frame have been calculated by the 8 bit FCS function 1, the final FCS value 7 is the FCS value for the entire frame. The final FCS value is then compared against the FCS value in the frame to determine if any errors have been introduced into the frame. If there is no FCS value in the frame, the final FCS value is added to the frame so that another receiving station can determine if errors have been introduced.

When the initial data word 3 is first used by the 8 bit FCS function 1, the FCS value in the FCS storage 7 is set to a default value, preferably all 1's.

The calculations for the 8 bit FCS function 1 are as follows, where "xor" is the logical function "exclusive or", FCS0 is the previous FCS value 7 and FCS1 is the present or newly calculated FCS value 11, FIG. 1, and datain is data word 3:

FCS1(31)=datain(5) xor FCS0(23) xor FCS0(29)

FCS1(30)=datain(4) xor datain(7) xor FCS0(22) xor FCS0(28) xor FCS0(31)

FCS1(29)=datain(3) xor datain(6) xor datain(7) xor FCS0(21) xor FCS0(27) xor FCS0(30) xor FCS0(31)

FCS1(28)=datain(2) xor datain(5) xor datain(6) xor FCS0(20) xor FCS0(26) xor FCS0(29) xor FCS0(30)

FCS1(27)=datain(1) xor datain(4) xor datain(5) xor datain(7) xor FCS0(19) xor FCS0(25) xor FGS0(28) xor FCS0(29) xor FCS0(31);

FCS1(26)=datain(0) xor datain(3) xor datain(4) xor datain(6) xor FCS0(18) xor FCS0(24) xor FCS0(27) xor FCS0(28) xor FCS0(30);

FCS1(25)=datain(2) xor datain(3) xor FCS0(17) xor FCS0(26) xor FCS0(27)

FCS1(24)=datain(1) xor datain(2) xor datain(7) xor FCS0(16) xor FCS0(25) xor FCS0(26) xor FCS0(31)

FCS1(23)=datain(0) xor datain(1) xor datain(6) xor FCS0(15) xor FCS0(24) xor FCS0(25) xor FCS0(30)

FCS1(22)=datain(0) xor FCS0(14) xor FCS0(24)

FCS1(21)=datain(5) xor FCS0(13) xor FCS0(29)

FCS1(20)=datain(4) xor FCS0(12) xor FCS0(28)

FCS1(19)=datain(3) xor datain(7) xor FCS0(11) xor FCS0(27) xor FCS0(31)

FCS1(18)=datain(2) xor datain(6) xor datain(7) xor FCS0(10) xor FCS0(26) xor FCS0(30) xor FCS0(31)

FCS1(17)=datain(1) xor datain(5) xor datain(6) xor FCS0(9) xor FCS0(25) xor FCS0(29) xor FCS0(30)

FCS1(16)=datain(0) xor datain(4) xor datain(5) xor FCS0(8) xor FCS0(24) xor FCS0(28) xor FCS0(29)

FCS1(15)=datain(3) xor datain(4) xor datain(5) xor datain(7) xor FCS0(7) xor FCS0(27) xor FCS0(28) xor FCS0(29) xor FCS0(31)

FCS1(14)=datain(2) xor datain(3) xor datain(4) xor datain(6) xor datain(7) xor FCS0(6) xor FCS0(26) xor FCS0(27) xor FCS0(28) xor FCS0(30) xor FCS0(31)

FCS1(13)=datain(1) xor datain(2) xor datain(3) xor datain(5) xor datain(6) xor datain(7) xor FCS0(5) xor FCS0(25) xor FCS0(26) xor FCS0(27) xor FCS0(29) xor FCS0(30) xor FCS0(31)

FCS1(12)=datain(0) xor datain(1) xor datain(2) xor datain(4) xor datain(5) xor datain(6) xor FCS0(4) xor FCS0(24) xor FCS0(25) xor FCS0(26) xor FCS0(28) xor FCS0(29) xor FCS0(30)

FCS1(11)=datain(0) xor datain(1) xor datain(3) xor datain(4) xor FCS0(3) xor FCS0(24) xor FCS0(25) xor FCS0(27) xor FCS0(28) FCS1(10)=datain(0) xor datain(2) xor datain(3) xor datain(5) xor FCS0(2) xor FCS0(24) xor FCS0(26) xor FCS0(27) xor FCS0(29)

FCS1(9)=datain(1) xor datain(2) xor datain(4) xor datain(5) xor FCS0(1) xor FCS0(25) xor FCS0(26) xor FCS0(28) xor FCS0(29)

FCS1(8)=datain(0) xor datain(1) xor datain(3) xor datain(4) xor FCS0(0) xor FCS0(24) xor FCS0(25) xor FCS0(27) xor FCS0(28)

FCS1(7)=datain(0) xor datain(2) xor datain(3) xor datain(5) xor datain(7) xor FCS0(24) xor FCS0(26) xor FCS0(27) xor FCS0(29) xor FCS0(31)

FCS1(6)=datain(1) xor datain(2) xor datain(4) xor datain(5) xor datain(6) xor datain(7) xor FCS0(25) xor FCS0(26) xor FCS0(28) xor FCS0(29) xor FCS0(30) xor FCS0(31)

FCS1(5)=datain(0) xor datain(1) xor datain(3) xor datain(4) xor datain(5) xor datain(6) xor datain(7) xor FCS0(24) xor FCS0(25) xor FCS0(27) xor FCS0(28) xor FCS0(29) xor FCS0(30) xor FCS0(31)

FCS1(4)=datain(0) xor datain(2) xor datain(3) xor datain(4) xor datain(6) xor FCS0(24) xor FCS0(26) xor FCS0(27) xor FCS0(28) xor FCS0(30)

FCS1(3)=datain(1) xor datain(2) xor datain(3) xor datain(7) xor FCS0(25) xor FCS0(26) xor FCS0(27) xor FCS0(31)

FCS1(2)=datain(0) xor datain(1) xor datain(2) xor datain(6) xor datain(7) xor FCS0(24) xor FCS0(25) xor FCS0(26) xor FCS0(30) xor FCS0(31)

FCS1(1)=datain(0) xor datain(1) xor datain(6) xor datain(7) xor FCS0(24) xor FCS0(25) xor FCS0(30) xor FCS0(31)

FCS1(0)=datain(0) xor datain(6) xor FCS0(24) xor FCS0(30)

Figure 2:
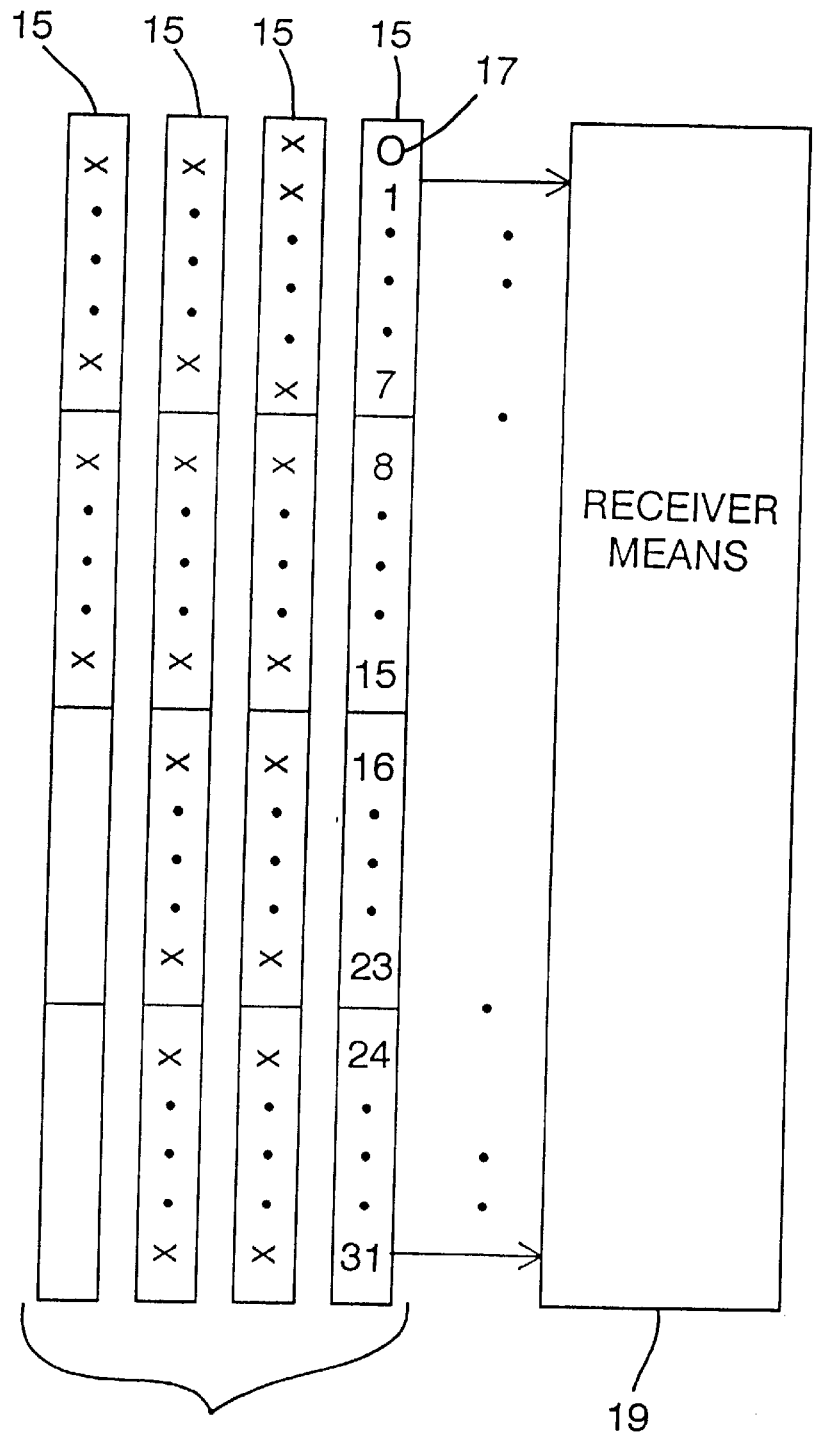
FIG. 2 is a schematic diagram of the receiving of the segments.

In the preferred embodiment as shown in FIG. 2, each frame 13 is divided into a plurality of segments 15, where each segment 15 has 32 segment bits 17. If the number of bits in the frame 13 is not an integer multiple of 32, the last segment 15 is not completely filled. All the segment bits 17 of a segment 15 are received simultaneously by a receiver means 19. Throughout the present invention, all the segment bits 17 are operated on at the same time, and in a batch type operation.

Figure 3:
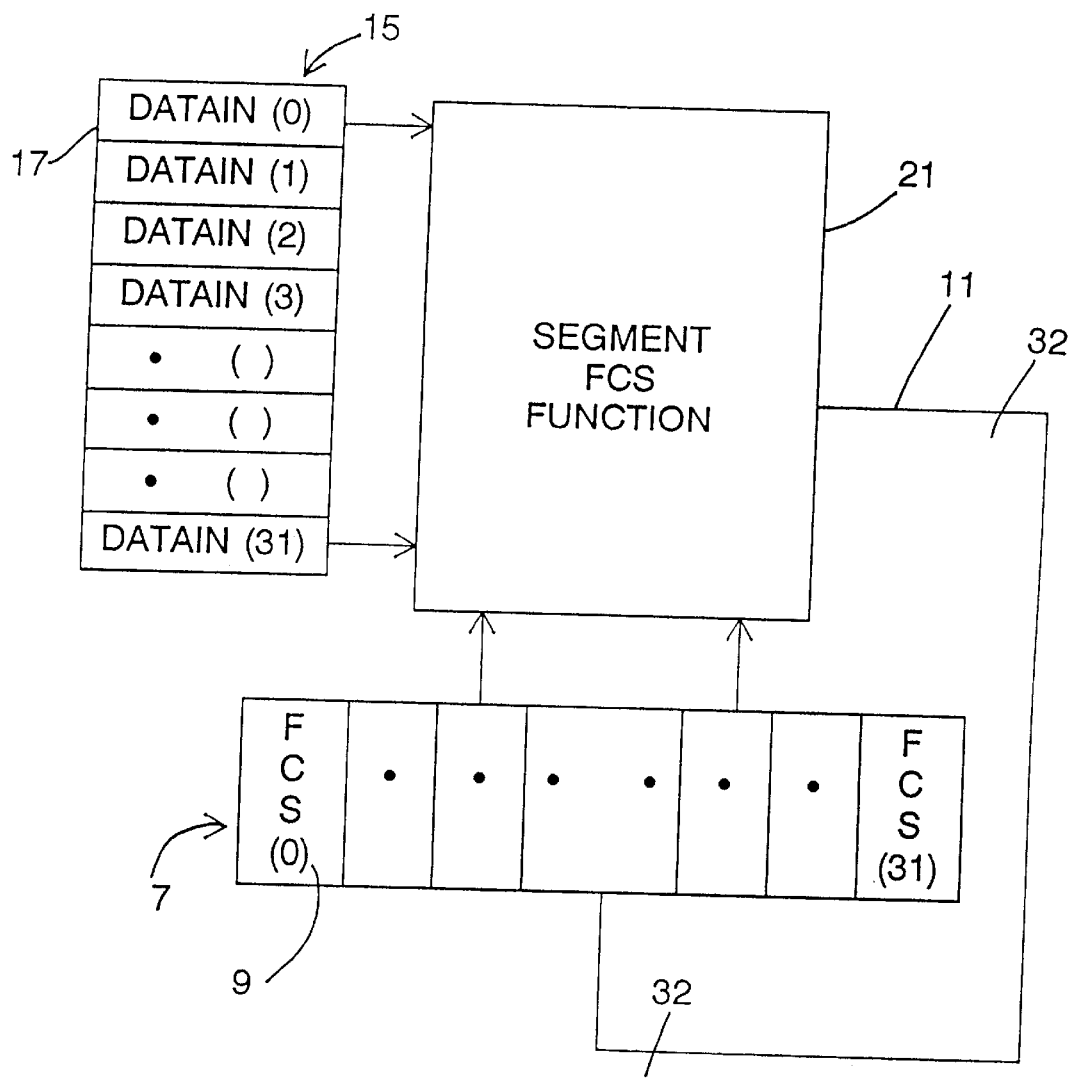
FIG. 3 is a schematic diagram of a 32 bit FCS function.
Figure 4:
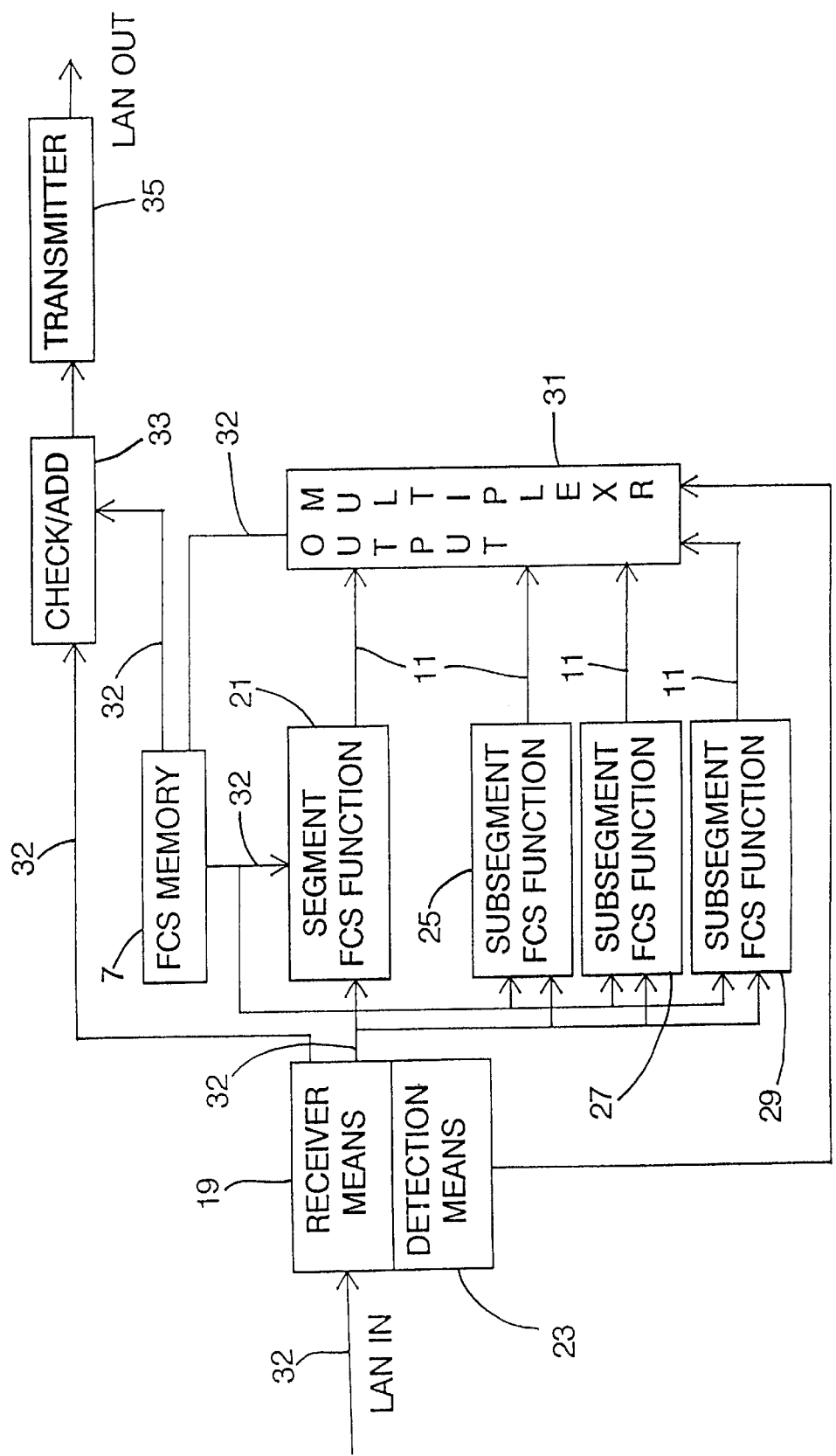
FIG. 4 is a schematic diagram of a larger view of the invention.
Figure 5:
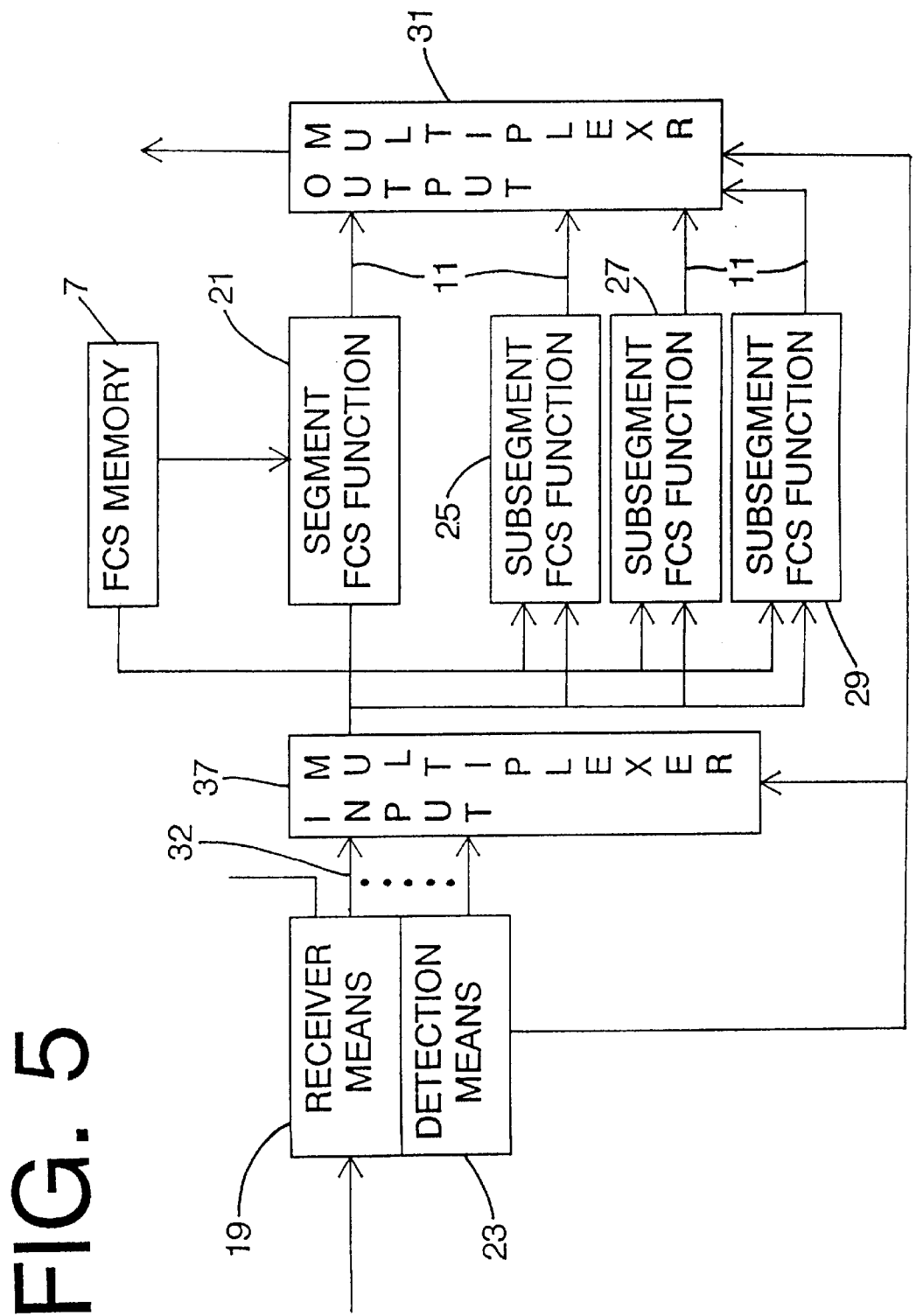
FIG. 5 is a schematic diagram of an embodiment of the present invention with an input multiplexer.
Figure 6:
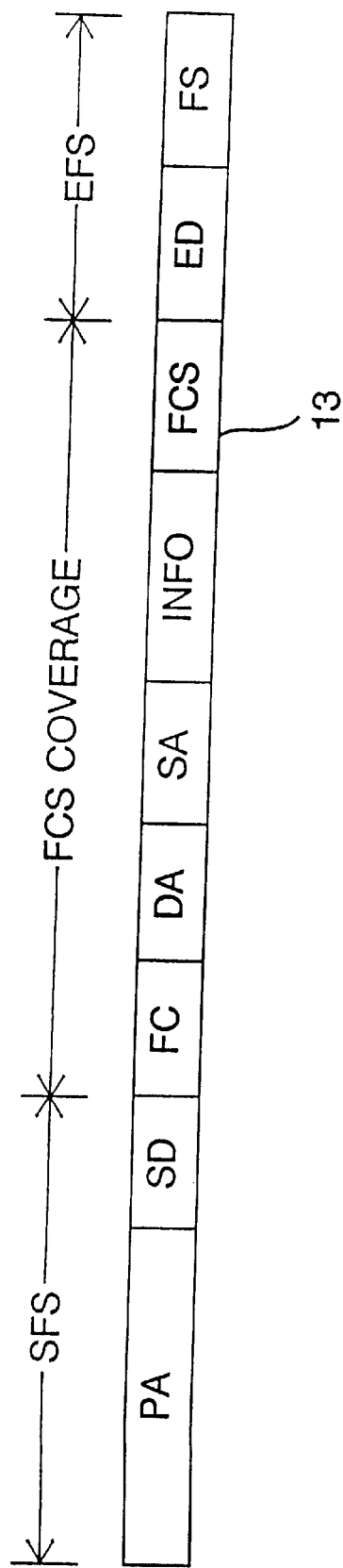
FIG. 6 is a diagram of an FDDI frame.

The present invention therefore includes a segment FCS function 21 as shown in FIG. 3. The entire segment 15 is fed to the segment FCS function 21, and all the segment bits 17 are received by the segment FCS function 21 at the same time.

In order to determine the segment FCS function 21, the 8 bit FCS function equations are applied to the first 8 bits, datain (31–24) of the segment 15. These equations are the same as the equations previously presented with the difference that the datain values are datain (24–31) instead of datain (0–7). The equations with datain (24–31) are repeated below.

FCS1(31)=datain(29) xor FCS0(23) xor FCS0(29)

FCS1(30)=datain(28) xor datain(31) xor FCS0(22) xor FCS0(28) xor FCS0(31)

FCS1(29)=datain(27) xor datain(30) xor datain(31) xor FCS0(21) xor FCS0(27) xor FCS0(30) xor FCS0(31)

FCS1(28)=datain(26) xor datain(29) xor datain(30) xor FCS0(20) xor FCS0(26) xor FCS0(29) xor FCS0(30)

FCS1(27)=datain(25) xor datain(28) xor datain(29) xor datain(31) xor FCS0(19) xor FCS0(25) xor FCS0(28) xor FCS0(29) xor FCS0(31)

FCS1(26)=datain(24) xor datain(27) xor datain(28) xor datain(30) xor FCS0(18) xor FCS0(24) xor FCS0(27) xor FCS0(28) xor FCS0(30)

FCS1(25)=datain(26) xor datain(27) xor FCS0(17) xor FCS0(26) xor FCS0(27)

FCS1(24)=datain(25) xor datain(26) xor datain(31) xor FCS0(16) xor FCS0(25) xor FCS0(26) xor FCS0(31)

FCS1(23)=datain(24) xor datain(25) xor datain(30) xor FCS0(15) xor FCS0(24) xor FCS0(25) xor FCS0(30)

FCS1(22)=datain(24) xor FCS0(14) xor FCS0(24)

FCS1(21)=datain(29) xor FCS0(13) xor FCS0(29)

FCS1(20)=datain(28) xor FCS0(12) xor FCS0(28)

FCS1(19)=datain(27) xor datain(31) xor FCS0(11) xor FCS0(27) xor FCS0(31)

FCS1(18)=datain(26) xor datain(30) xor datain(31) xor FCS0(10) xor FCS0(26) xor FCS0(30) xor FCS0(31)

FCS1(17)=datain(25) xor datain(29) xor datain(30) xor FCS0(9) xor FCS0(25) xor FCS0(29) xor FCS0(30)

FCS1(16)=datain(24) xor datain(28) xor datain(29) xor FCS0(8) xor FCS0(24) xor FCS0(28) xor FCS0(29)

FCS1(15)=datain(27) xor datain(28) xor datain(29) xor datain(31) xor FCS0(7) xor FCS0(27) xor FCS0(28) xor FCS0(29) xor FCS0(31)

FCS1(14)=datain(26) xor datain(27) xor datain(28) xor datain(30) xor datain(31) xor FCS0(6) xor FCS0(26) xor FCS0(27) xor FCS0(28) xor FCS0(30) xor FCS0(31)

FCS1(13)=datain(25) xor datain(26) xor datain(27) xor datain(29) xor datain(30) xor datain(31) xor FCS0(5) xor FCS0(25) xor FCS0(26) xor FCS0(27) xor FCS0(29) xor FCS0(30) xor FCS0(31)

FCS1(12)=datain(24) xor datain(25) xor datain(26) xor datain(28) xor datain(29) xor datain(30) xor FCS0(4) xor FCS0(24) xor FCS0(25) xor FCS0(26) xor FCS0(28) xor FCS0(29) xor FCS0(30)

FCS1(11)=datain(24) xor datain(25) xor datain(27) xor datain(28) xor FCS0(3) xor FCS0(24) xor FCS0(25) xor FCS0(27) xor FCS0(28)

FCS1(10)=datain(24) xor datain(26) xor datain(27) xor datain(29) xor FCS0(2) xor FCS0(24) xor FCS0(26) xor FCS0(27) xor FCS0(29)

FCS1(9)=datain(25) xor datain(26) xor datain(28) xor datain(29) xor FCS0(1) xor FCS0(25) xor FCS0(26) xor FCS0(28) xor FCS0(29)

FCS1(8)=datain(24) xor datain(25) xor datain(27) xor datain(28) xor FCS0(0) xor FCS0(24) xor FCS0(25) xor FCS0(27) xor FCS0(28)

FCS1(7)=datain(24) xor datain(26) xor datain(27) xor datain(29) xor datain(31) xor FCS0(24) xor FCS0(26) xor FCS0(27) xor FCS0(29) xor FCS0(31)

FCS1(6)=datain(25) xor datain(26) xor datain(28) xor datain(29) xor datain(30) xor datain(31) xor FCS0(25) xor FCS0(26) xor FCS0(28) xor FCS0(29) xor FCS0(30) xor FCS0(31)

FCS1(5)=datain(24) xor datain(25) xor datain(27) xor datain(28) xor datain(29) xor datain(30) xor datain(31) xor FCS0(24) xor FCS0(25) xor FCS0(27) xor FCS0(28) xor FCS0(29) xor FCS0(30) xor FCS0(31)

FCS1(4)=datain(24) xor datain(26) xor datain(27) xor datain(28) xor datain(30) xor FCS0(24) xor FCS0(26) xor FCS0(27) xor FCS0(28) xor FCS0(30)

FCS1(3)=datain(25) xor datain(26) xor datain(27) xor datain(31) xor FCS0(25) xor FCS0(26) xor FCS0(27) xor FCS0(31)

FCS1(2)=datain(24) xor datain(25) xor datain(26) xor datain(30) xor datain(31) xor FCS0(24) xor FCS0(25) xor FCS0(26) xor FCS0(30) xor FCS0(31)

FCS1(1)=datain(24) xor datain(25) xor datain(30) xor datain(31) xor FCS0(24) xor FCS0(25) xor FCS0(30) xor FCS0(31)

FCS1(0)=datain(24) xor datain(30) xor FCS0(24) xor FCS0(30)

If we continued to use the 8 bit FCS function 1, we would then begin to work on the next data word, datain (16–23), and to calculate the next FCS value which will be named FCS2. The equation for FCS2(31) for the next data word is the same as for FCS1(31) except that it uses a different previous FCS value 7. The equation is as follows:

FCS2(31)=datain(21) xor FCS1(23) xor FCS1(29)

However, we note from our previous equations that what we are now using as FCS1(23) was the FCS1(23) that we just previously calculated and is as follows:

FCS1(23)=datain(24) xor datain(25) xor datain(30) xor FCS0(15) xor FCS0(24) xor FCS0(25) xor FCS0(30)

Accordingly FCS1(29) was the previously calculate FCS1 (29) and is as follows:

FCS1(29)=datain(27) xor datain(30) xor datain(31) xor FCS0(21) xor FCS0(27) xor FCS0(30) xor FCS0(31)

The above equations are combined to form:

FCS2(31)=datain(21) xor datain(24) xor datain(25) xor datain(30) xor FCS0(15) xor FCS0(24) xor FCS0(25) xor FCS0(30) xor datain(27) xor datain(30) xor datain (31) xor FCS0(21) xor FCS0(27) xor FCS0(30) xor FCS0(31)

The equation can then be simplified by removing redundant terms and terms which cancel each other, to form the following equation:

FCS2(31)=datain(21) xor datain(24) xor datain(25) xor FCS0(15) xor FCS0(24) xor FCS0(25) xor datain(27) xor datain(31) xor FCS0(21) xor FCS0(27) xor FCS0(31)

This process is continued for the remaining 31 equations calculating the next FCS2 value for the second 8 bit data word in the frame 13. The FCS2 equations can then be used to calculate the FCS value of 16 bits simultaneously in a batch type operation.

The process is then repeated for the third data word where the new FCS value will be named FCS3 and uses the previous FCS value FCS2. The FCS3 equations can then be used to calculate the FCS value of 24 bits simultaneously in a batch type operation.

In the preferred embodiment, the process is repeated a fourth time for the fourth data word, which will be named FCS4 and uses the previous FCS value FCS3. The FCS4 equations can then be used to calculate the FCS value of 32 bits simultaneously in a batch type operation.

In the present invention each segment does not need to be limited to 32 bits. Each segment could have more than 32 bits. If the number of bits is greater than 32 and an integer multiple of 8, then the above process of determining FCS equations for 16, 24, and 32 bits at a time is continued, such as for 40, 48, 56 and 64 or even 128 bits.

By the substituting of FSC1 into FSC2, FSC2 into FCS3 and FCS3 into FCS4, many calculations are eliminated. Once all the equations have been combined and simplified, the resulting equation for the segment FCS function 21 which operates on the 32 bit segment 15 is as follows:

FCS4(31)=datain(5) xor datain(8) xor datain(9) xor datain(25) xor datain(28) xor FCS0(25) xor FCS0(28) xor datain(23) xor FCS0(8) xor FCS0(23) xor FCS0(9) xor datain(24) xor FCS0(27) xor FCS0(24) xor datain(11) xor datain(15) xor datain(29) xor FCS0(5) xor FCS0(29) xor FCS0(11) xor FCS0(15) xor datain(31) xor FCS0(31) xor datain(30) xor FCS0(30)

FCS4(30)=datain(4) xor datain(7) xor datain(8) xor datain(22) xor datain(24) xor datain(27) xor FCS0(24) xor FCS0(27) xor FCS0(22) xor FCS0(8) xor datain(26) xor FCS0(26) xor datain(10) xor datain(14) xor datain(28) xor FCS0(4) xor FCS0(28) xor FCS0(10) xor FCS0(29) xor datain(29) xor FCS0(14) xor datain(30) xor FCS0(30) xor FCS0(7) xor datain(23) xor FCS0(23)

FCS4(29)=datain(3) xor datain(6) xor datain(7) xor datain(21) xor datain(26) xor FCS0(26) xor FCS0(21) xor datain(25) xor FCS0(25) xor datain(9) xor datain(27) xor FCS0(3) xor datain(31) xor FCS0(9) xor FCS0(27) xor FCS0(13) xor FCS0(29) xor datain(29) xor datain(28) xor FCS0(28) xor FCS0(6) xor datain(22) xor FCS0(22) xor FCS0(31) xor datain(13) xor FCS0(7) xor datain(23) xor FCS0(23)

FCS4(28)=datain(2) xor datain(5) xor datain(6) xor datain(20) xor datain(25) xor FCS0(25) xor FCS0(20) xor datain(24) xor FCS0(24) xor datain(8) xor FCS0(2) xor FCS0(26) xor FCS0(8) xor FCS0(30) xor datain(27) xor FCS0(27) xor FCS0(12) xor datain(28) xor FCS0(28) xor datain(21) xor FCS0(5) xor FCS0(21) xor datain(26) xor datain(30) xor datain(12) xor FCS0(6) xor datain(22) xor FCS0(22)

FCS4(27)=datain(1) xor datain(4) xor datain(5) xor datain(7) xor FCS0(19) xor FCS0(23) xor datain(24) xor FCS0(24) xor datain(11) xor datain(25) xor datain(29) xor FCS0(1) xor FCS0(25) xor FCS0(29) xor datain(19) xor FCS0(26) xor datain(23) xor FCS0(27) xor FCS0(27) xor datain(20) xor FCS0(4) xor FCS0(20) xor datain(21) xor FCS0(5) xor FCS0(21) xor FCS0(11) xor datain(26) xor FCS0(7)

FCS4(26)=datain(0) xor datain(3) xor datain(4) xor datain(6) xor datain(22) xor FCS0(22) xor datain(23) xor FCS0(23) xor FCS0(0) xor FCS0(28) xor datain(18) xor datain(24) xor FCS0(18) xor FCS0(24) xor datain(26) xor FCS0(26) xor datain(25) xor FCS0(25) xor datain(19) xor FCS0(3) xor datain(31) xor FCS0(19) xor FCS0(31) xor datain(28) xor datain(10) xor datain(20) xor FCS0(4) xor FCS0(20) xor FCS0(10) xor FCS0(6)

FCS4(25)=datain(2) xor datain(3) xor datain(17) xor datain(21) xor FCS0(17) xor FCS0(21) xor datain(31) xor FCS0(31) xor datain(22) xor FCS0(22) xor datain(8) xor datain(11) xor datain(18) xor FCS0(2) xor FCS0(18) xor FCS0(8) xor FCS0(11) xor datain(15) xor datain(19) xor FCS0(3) xor FCS0(19) xor FCS0(15) xor FCS0(29) xor datain(29) xor datain(28) xor FCS0(28)

FCS4(24)=datain(1) xor datain(2) xor datain(7) xor datain(20) xor FCS0(16) xor FCS0(20) xor datain(30) xor datain(21) xor FCS0(21) xor datain(10) xor FCS0(1) xor FCS0(30) xor datain(16) xor FCS0(10) xor datain(14) xor datain(18) xor FCS0(2) xor FCS0(18) xor datain(27) xor FCS0(27) xor datain(28) xor FCS0(28) xor FCS0(14) xor datain(17) xor FCS0(7) xor FCS0(17)

FCS4(23)=datain(0) xor datain(1) xor datain(6) xor datain(11) xor datain(13) xor datain(17) xor datain(20) xor FCS0(17) xor FCS0(20) xor FCS0(13) xor datain(29) xor datain(9) xor datain(15) xor FCS0(0) xor FCS0(9) xor datain(26) xor FCS0(26) xor datain(11) xor FCS0(1) xor FCS0(29) xor datain(19) xor FCS0(16) xor FCS0(19) xor datain(27) xor FCS0(27) xor datain(16) xor FCS0(6) xor FCS0(15) xor datain(31) xor FCS0(31)

FCS4(22)=datain(0) xor datain(11) xor datain(12) xor datain(14) xor datain(23) xor FCS0(23) xor datain(16) xor datain(19) xor FCS0(16) xor FCS0(19) xor FCS0(11) xor datain(18) xor FCS0(12) xor FCS0(14) xor datain(27) xor datain(31) xor FCS0(27) xor FCS0(31) xor datain(9) xor FCS0(0) xor datain(29) xor FCS0(29) xor FCS0(9) xor datain(24) xor FCS0(18) xor FCS0(24) xor datain(26) xor FCS0(26)

FCS4(21)=datain(5) xor datain(9) xor datain(10) xor datain(13) xor datain(22) xor datain(18) xor FCS0(9) xor datain(24) xor datain(27) xor FCS0(18) xor FCS0(10) xor FCS0(26) xor FCS0(22) xor FCS0(27) xor FCS0(13) xor FCS0(24) xor datain(29) xor FCS0(5) xor FCS0(29) xor datain(17) xor FCS0(17) xor datain(31) xor FCS0(31) xor datain(26)

FCS4(20)=datain(4) xor datain(8) xor datain(9) xor datain(12) xor datain(17) xor datain(23) xor FCS0(8) xor FCS0(17) xor FCS0(23) xor FCS0(9) xor FCS0(26) xor datain(21) xor FCS0(12) xor FCS0(21) xor datain(28) xor datain(25) xor FCS0(25) xor datain(26) xor FCS0(4) xor FCS0(28) xor datain(16) xor FCS0(16) xor datain(30) xor FCS0(30)

FCS4(19)=datain(3) xor datain(7) xor datain(8) xor datain(11) xor FCS0(24) xor datain(25) xor FCS0(25) xor FCS0(8) xor datain(20) xor FCS0(11) xor FCS0(20) xor datain(22) xor datain(24) xor FCS0(22) xor datain(15) xor datain(27) xor FCS0(3) xor FCS0(15) xor FCS0(27) xor FCS0(29) xor datain(29) xor datain(16) xor FCS0(7) xor FCS0(16)

FCS4(18)=datain(2) xor datain(6) xor datain(7) xor datain(10) xor datain(24) xor FCS0(24) xor FCS0(10) xor datain(21) xor FCS0(21) xor datain(14) xor FCS0(2) xor FCS0(26) xor datain(26) xor datain(28) xor FCS0(28) xor FCS0(14) xor datain(15) xor FCS0(6) xor FCS0(15) xor datain(31) xor FCS0(7) xor FCS0(31) xor datain(19) xor datain(23) xor FCS0(19) xor FCS0(23)

FCS4(17)=datain(1) xor datain(5) xor datain(6) xor datain(9) xor datain(13) xor FCS0(9) xor datain(31) xor datain(20) xor FCS0(20) xor FCS0(13) xor datain(25) xor FCS0(1) xor FCS0(25) xor datain(23) xor datain(27) xor FCS0(27) xor FCS0(23) xor datain(14) xor FCS0(5) xor FCS0(31) xor FCS0(14) xor datain(30) xor FCS0(6) xor FCS0(30) xor datain(18) xor datain(22) xor FCS0(18) xor FCS0(22)

FCS4(16)=datain(0) xor datain(4) xor datain(5) xor datain(8) xor datain(12) xor FCS0(16) xor FCS0(8) xor FCS0(18) xor datain(19) xor FCS0(19) xor datain(22) xor FCS0(12) xor FCS0(0) xor datain(24) xor FCS0(18) xor FCS0(24) xor FCS0(26) xor FCS0(22) xor datain(13) xor FCS0(4) xor FCS0(16) xor FCS0(13) xor datain(30) xor FCS0(30) xor datain(21) xor datain(29) xor FCS0(5) xor FCS0(29) xor FCS0(21) xor datain(17) xor FCS0(17) xor datain(26)

FCS4(15)=datain(3) xor datain(4) xor datain(5) xor datain(7) xor datain(8) xor datain(18) xor FCS0(8) xor datain(30) xor FCS0(18) xor FCS0(30) xor datain(16) xor FCS0(16) xor datain(24) xor FCS0(24) xor datain(9) xor datain(12) xor datain(15) xor datain(27) xor FCS0(3) xor FCS0(9) xor FCS0(15) xor FCS0(27) xor FCS0(12) xor datain(20) xor FCS0(4) xor FCS0(20) xor datain(21) xor FCS0(5) xor FCS0(21) xor FCS0(7)

FCS4(14)=datain(2) xor datain(3) xor datain(4) xor datain(6) xor datain(7) xor datain(14) xor datain(15) xor datain(19) xor FCS0(29) xor FCS0(19) xor datain(29) xor FCS0(14) xor FCS0(15) xor datain(8) xor datain(11) xor FCS0(2) xor FCS0(26) xor FCS0(8) xor datain(26) xor FCS0(11) xor FCS0(3) xor datain(20) xor FCS0(4) xor FCS0(20) xor FCS0(6) xor datain(17) xor FCS0(7) xor FCS0(17) xor datain(23) xor FCS0(23)

FCS4(13)=datain(1) xor datain(2) xor datain(3) xor datain(5) xor datain(6) xor datain(7) xor datain(28) xor FCS0(28) xor FCS0(13) xor FCS0(14) xor datain(10) xor datain(25) xor FCS0(1) xor FCS0(25) xor datain(19) xor FCS0(10) xor FCS0(16) xor FCS0(19) xor datain(14) xor datain(18) xor FCS0(2) xor datain(13) xor FCS0(3) xor FCS0(31) xor FCS0(5) xor FCS0(6) xor datain(22) xor FCS0(18) xor FCS0(22) xor datain(31) xor datain(16) xor FCS0(7)

FCS4(12)=datain(0) xor datain(1) xor datain(2) xor datain(4) xor datain(5) xor datain(6) xor FCS0(12) xor datain(9) xor FCS0(0) xor FCS0(1) xor FCS0(2) xor FCS0(4) xor FCS0(5) xor FCS0(6) xor FCS0(9) xor datain(24) xor FCS0(24) xor FCS0(27) xor datain(27) xor datain(30) xor datain(13) xor datain(18) xor FCS0(13) xor FCS0(30) xor datain(21) xor FCS0(21) xor FCS0(17) xor FCS0(17) xor FCS0(15) xor datain(12) xor datain(15) xor FCS0(18) xor datain(31) xor FCS0(31)

FCS4(11)=datain(0) xor datain(1) xor datain(3) xor datain(4) xor FCS0(9) xor datain(17) xor FCS0(27) xor FCS0(17) xor datain(25) xor FCS0(25) xor datain(15) xor FCS0(0) xor datain(24) xor FCS0(24) xor FCS0(15) xor FCS0(1) xor datain(16) xor datain(26) xor FCS0(26) xor FCS0(16) xor datain(9) xor datain(12) xor datain(27) xor FCS0(3) xor datain(31) xor FCS0(31) xor FCS0(12) xor datain(14) xor datain(20) xor datain(28) xor FCS0(4) xor FCS0(28) xor FCS0(20) xor FCS0(14)

FCS4(10)=datain(0) xor datain(2) xor datain(3) xor datain(5) xor FCS0(26) xor datain(16) xor FCS0(16) xor datain(28) xor FCS0(0) xor FCS0(28) xor datain(29) xor FCS0(9) xor datain(14) xor FCS0(2) xor FCS0(31) xor datain(26) xor datain(9) xor datain(13) xor datain(19) xor FCS0(3) xor datain(31) xor FCS0(19) xor FCS0(13) xor FCS0(29) xor FCS0(5) xor FCS0(14)

FCS4(9)=datain(1) xor datain(2) xor datain(4) xor datain(5) xor datain(9) xor FCS0(9) xor datain(24) xor FCS0(24) xor FCS0(1) xor FCS0(29) xor datain(23) xor FCS0(23) xor datain(12) xor datain(18) xor FCS0(2) xor FCS0(18) xor FCS0(12) xor datain(13) xor FCS0(4) xor FCS0(13) xor datain(29) xor datain(11) xor FCS0(5) xor FCS0(11)

FCS4(8)=datain(0) xor datain(1) xor datain(3) xor datain(4) xor datain(8) xor datain(17) xor FCS0(8) xor FCS0(17) xor FCS0(0) xor datain(22) xor FCS0(10) xor FCS0(22) xor datain(11) xor FCS0(1) xor datain(23) xor FCS0(11) xor FCS0(23) xor datain(12) xor FCS0(3) xor datain(31) xor FCS0(31) xor FCS0(12) xor datain(28) xor FCS0(28) xor datain(10) xor FCS0(4)

FCS4(7)=datain(0) xor datain(2) xor datain(3) xor datain(5) xor datain(7) xor datain(10) xor FCS0(0) xor FCS0(28) xor FCS0(29) xor datain(24) xor FCS0(24) xor datain(22) xor FCS0(10) xor FCS0(22) xor datain(25) xor FCS0(15) xor FCS0(25) xor datain(8) xor FCS0(2) xor FCS0(8) xor datain(28) xor datain(15) xor FCS0(3) xor datain(29) xor datain(21) xor FCS0(5) xor FCS0(21) xor datain(16) xor FCS0(7) xor FCS0(16) xor datain(23) xor FCS0(23)

FCS4(6)=datain(1) xor datain(2) xor datain(4) xor datain(5) xor datain(6) xor datain(7) xor datain(11) xor datain(25) xor datain(29) xor FCS0(1) xor FCS0(25) xor datain(8) xor FCS0(2) xor FCS0(8) xor datain(14) xor datain(20) xor FCS0(4) xor FCS0(20) xor FCS0(29) xor datain(21) xor FCS0(5) xor FCS0(21) xor FCS0(11) xor FCS0(14) xor datain(30) xor FCS0(6) xor FCS0(30) xor datain(22) xor FCS0(22) xor FCS0(7)

FCS4(5)=datain(0) xor datain(1) xor datain(3) xor datain(4) xor datain(5) xor datain(6) xor datain(7) xor datain(10) xor FCS0(0) xor FCS0(28) xor datain(29) xor datain(24) xor FCS0(24) xor FCS0(10) xor FCS0(1) xor datain(19) xor FCS0(19) xor datain(13) xor FCS0(3) xor datain(28) xor datain(20) xor FCS0(4) xor FCS0(20) xor FCS0(13) xor FCS0(29) xor datain(21) xor FCS0(5) xor FCS0(21) xor FCS0(6) xor FCS0(7)

FCS4(4)=datain(0) xor datain(2) xor datain(3) xor datain(4) xor datain(6) xor FCS0(0) xor datain(29) xor FCS0(29) xor datain(24) xor FCS0(24) xor datain(25) xor FCS0(15) xor FCS0(25) xor datain(8) xor datain(11) xor FCS0(2) xor FCS0(8) xor FCS0(11) xor FCS0(12) xor datain(30) xor datain(12) xor datain(15) xor datain(19) xor FCS0(3) xor datain(31) xor FCS0(19) xor FCS0(31) xor datain(20) xor FCS0(4) xor FCS0(20) xor FCS0(30) xor FCS0(6) xor datain(18) xor FCS0(18)

FCS4(3)=datain(1) xor datain(2) xor datain(3) xor datain(7) xor datain(10) xor datain(25) xor FCS0(1) xor FCS0(25) xor FCS0(10) xor FCS0(19) xor datain(27) xor FCS0(27) xor datain(8) xor datain(14) xor datain(18) xor FCS0(2) xor FCS0(18) xor datain(31) xor FCS0(31) xor FCS0(8) xor FCS0(14) xor datain(9) xor datain(15) xor FCS0(3) xor FCS0(9) xor FCS0(15) xor datain(17) xor FCS0(7) xor FCS0(17) xor datain(19)

said combining including removing redundant terms and terms which cancel each other to form a segment FCS function;

calculating an intermediate FCS for said bits of said segment in a batch operation using said segment FCS function for said each segment as said each segment is received.

2. A method in accordance with claim 1, wherein:
said number of bits is an integer multiple of 8.

3. A method in accordance with claim 1, wherein:
bits of the data frame are unevenly divided into said segments;
said calculations of said FCS function are combined to form a plurality of subsegment FCS functions, each subsegment FCS function calculating a FCS for a different number of bits of said segment;
sensing a number of said bits of the data frame in a received segment;
generating a FCS for said received segment using one of said FCS functions corresponding to said sensed number of bits.

4. A method in accordance with claim 1, wherein:
bits of the data frame are unevenly divided into said segments;
said calculations of said FCS function are combined to form a plurality of subsegment FCS functions, each subsegment FCS functions calculating a FCS for a different number of bits;
operating each of said FCS functions simultaneously on each received segment;
sensing a number of bits of the data frame in said received segment;
using a result from one of said plurality of FCS function corresponding to said sensed number of bits for calculating an FCS of a next said segment.

5. A method in accordance with claim 1, further comprising:
receiving the frame from and transmitting the frame to an Ethernet computer network.

6. A method in accordance with claim 1, further comprising:
receiving the frame from and transmitting the frame to an FDDI computer network.

7. A method in accordance with claim 1, wherein:
said 8 bit FCS function combines the FCS of the 8 bits with a next 8 bits to calculate the FCS of the 8 bits and next 8 bits, said 8 bit FCS function then continuously repeating the combining of a previous FCS with a next 8 bits to calculate the FCS of the previous and additional bits until the FCS of all bits in the frame has been calculated;
said calculating of said intermediate FCS includes combining an intermediate FCS from a previous segment with a present segment to generate an intermediate FCS for said previous and present segment, repeating said combining for said each segment as said each segment is received until all of said segments are received and the FCS of a last segment received being a final FCS.

8. A method in accordance with claim 7, further comprising:
adding said final FCS to the data frame.

9. A method in accordance with claim 7, further comprising:
comparing said final FCS to a specific constant in a frame including an FCS and indicating a transmission error if said final FCS is not equal to said specific constant.

10. A method in accordance with claim 7, wherein:
bits of the data frame are unevenly divided into said segments;
said calculations of said FCS function are combined to form a plurality of subsegment FCS functions, each subsegment FCS functions calculating a FCS for a different number of bits;
each of said FCS functions are operated simultaneously on each received segment;
a number of bits of the data frame are sensed in said received segment;
a result from one of said plurality of FCS function corresponding to said sensed number of bits are used for calculating an FCS of a next said segment;
the frame is received from and transmitted to Ethernet and FDDI computer networks;
said number of bits of the frame, said segments and said FCS functions are an integer multiple of 8.

11. A device for generating a frame check sequence (FCS) of a transmitted frame in a computer network, the device comprising:
receiver means connectable to the computer network for receiving the frame in a plurality of sequential segments, each of said plurality of segments having a segment number of bits received simultaneously, said segment number being greater than 8 bits;
segment FCS means connected to said receiver means for combining in a batch operation all of said bits of one of said segments with a previous FCS to calculate a new FCS, said segment FCS means sequentially combining each of segments of the frame in separate said batch operations until the FCS is calculated for all said segments in the frame;
transmitter means for sequentially transmitting said plurality of segments onto the computer network.

12. A device in accordance with claim 11, wherein:
said segment number in said receiver means is identical for all of said segments, said receiver means includes detection means for detecting a frame number of bits from the frame included in each said segment;
a plurality of different subsegment FCS means are connected to said receiver means, each of said subsegment FCS means calculating a new FCS for different number of bits of said segment;
a multiplexer connected to all of said FCS means, said multiplexer also receiving said frame number, said multiplexer selecting said FCS means corresponding to said frame number.

13. A device in accordance with claim 12, wherein:
all of said FCS means calculate said new FCS for each said segment;
said multiplexer means only passes on said new FCS from said selected FCS means.

14. A device in accordance with claim 11, wherein:
said transmitter and receiver means are connectable to an Ethernet computer network.

15. A device in accordance with claim 11, wherein:
said transmitter and receiver means are connectable to an FDDI computer network.

16. A device in accordance with claim 11, wherein:
said segment number and a number of bits in the frame are an integer multiple of 8.

17. A device in accordance with claim 13, wherein:
said transmitter and receiver means are connectable to an FDDI computer network and an Ethernet computer network;

said segment number and a number of bits in the frame are an integer multiple of 8;

check means is connected to said receiver means for comparing said final FCS to a specific constant in a frame including an FCS and indicating a transmission error if said final FCS is not equal to said specific constant;

addition means connected to said transmitter means for adding said new FCS to the frame.

18. A device in accordance with claim 11, further comprising:

check means for comparing said new FCS with a frame FCS included with the frame and indicating a transmission error if said final FCS is not equal to said FCS included in the frame.

19. A device in accordance with claim 11, further comprising:

addition means for adding said new FCS to the frame.

* * * * *